US009576981B2

(12) United States Patent
Yamazaki et al.

(10) Patent No.: US 9,576,981 B2
(45) Date of Patent: Feb. 21, 2017

(54) SEMICONDUCTOR DEVICE HAVING A GATE INSULTING FILM WITH THICK PORTIONS ALIGNED WITH A TAPERED GATE ELECTRODE

(71) Applicant: Semiconductor Energy Laboratory Co., Ltd., Kanagawa-ken (JP)

(72) Inventors: Shunpei Yamazaki, Tokyo (JP); Hideomi Suzawa, Kanagawa (JP); Koji Ono, Kanagawa (JP); Yasuyuki Arai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 14/147,799

(22) Filed: Jan. 6, 2014

(65) Prior Publication Data

US 2014/0117364 A1    May 1, 2014

Related U.S. Application Data

(60) Continuation of application No. 13/169,224, filed on Jun. 27, 2011, now Pat. No. 8,624,248, which is a
(Continued)

(30) Foreign Application Priority Data

Jul. 22, 1999    (JP) ................................. 11-206942

(51) Int. Cl.
*H01L 29/04* (2006.01)
*H01L 29/10* (2006.01)
(Continued)

(52) U.S. Cl.
CPC ..... *H01L 27/1222* (2013.01); *H01L 21/32136* (2013.01); *H01L 27/124* (2013.01);
(Continued)

(58) Field of Classification Search
CPC ............... H01L 27/124; H01L 27/1237; H01L 29/66757; H01L 29/78627; H01L 29/42384
See application file for complete search history.

(56) References Cited

U.S. PATENT DOCUMENTS 4,394,182 A * 7/1983 Maddox, III ....... H01L 21/0277
257/350
5,247,190 A 9/1993 Friend et al.
(Continued)

FOREIGN PATENT DOCUMENTS

JP    61-292374    12/1986
JP    2-292833    12/1990
(Continued)

OTHER PUBLICATIONS

Wolf, S. et al, *Silicon Processing for the VLSI Era, vol. 1: Process Technology*, Lattice Press, 1986, Fig. 12 on p. 263 and p. 264.
(Continued)

*Primary Examiner* — Jesse Y Miyoshi
(74) *Attorney, Agent, or Firm* — Husch Blackwell LLP

(57) ABSTRACT

By providing appropriate TFT structures arranged in various circuits of the semiconductor device in response to the functions required by the circuits, it is made possible to improve the operating performances and the reliability of a semiconductor device, reduce power consumption as well as realizing reduced manufacturing cost and increase in yield by lessening the number of processing steps. An LDD region of a TFT is formed to have a concentration gradient of an impurity element for controlling conductivity which becomes higher as the distance from a drain region decreases. In order to form such an LDD region having a concentration gradient of an impurity element, the present invention uses a method in which a gate electrode having a taper portion is provided to thereby dope an ionized impurity
(Continued)

element for controlling conductivity accelerated in the electric field so that it penetrates through the gate electrode and a gate insulating film into a semiconductor layer.

19 Claims, 24 Drawing Sheets

Related U.S. Application Data continuation of application No. 12/009,754, filed on Jan. 22, 2008, now Pat. No. 7,968,890, which is a continuation of application No. 10/848,189, filed on May 18, 2004, now Pat. No. 7,335,911, which is a division of application No. 10/337,704, filed on Jan. 7, 2003, now Pat. No. 6,743,649, which is a division of application No. 09/618,930, filed on Jul. 18, 2000, now Pat. No. 6,541,294.

(51) Int. Cl.
*H01L 27/12* (2006.01)
*H01L 29/786* (2006.01)
*H01L 21/3213* (2006.01)
*H01L 29/423* (2006.01)
*H01L 29/49* (2006.01)
*H01L 29/66* (2006.01)
*G02F 1/1345* (2006.01)

(52) U.S. Cl.
CPC ........ *H01L 27/127* (2013.01); *H01L 27/1237* (2013.01); *H01L 27/1277* (2013.01); *H01L 29/42384* (2013.01); *H01L 29/4908* (2013.01); *H01L 29/66757* (2013.01); *H01L 29/78621* (2013.01); *H01L 29/78627* (2013.01); *H01L 29/78645* (2013.01); *G02F 1/13454* (2013.01); *H01L 2029/7863* (2013.01)

(56) References Cited

U.S. PATENT DOCUMENTS

| | | | |
|---|---|---|---|
| 5,292,675 A * | 3/1994 | Codama | H01L 29/66598 148/DIG. 150 |
| 5,323,042 A | 6/1994 | Matsumoto | |
| 5,399,502 A | 3/1995 | Friend et al. | |
| 5,528,397 A | 6/1996 | Zavracky et al. | |
| 5,532,176 A | 7/1996 | Katada et al. | |
| 5,583,369 A | 12/1996 | Yamazaki et al. | |
| 5,643,826 A | 7/1997 | Ohtani et al. | |
| 5,668,379 A | 9/1997 | Ono et al. | |
| 5,686,328 A | 11/1997 | Zhang et al. | |
| 5,705,424 A | 1/1998 | Zavracky et al. | |
| 5,729,308 A | 3/1998 | Yamazaki et al. | |
| 5,736,750 A | 4/1998 | Yamazaki et al. | |
| 5,739,549 A | 4/1998 | Takemura et al. | |
| 5,760,854 A | 6/1998 | Ono et al. | |
| 5,830,787 A | 11/1998 | Kim | |
| 5,834,816 A | 11/1998 | Jang | |
| 5,877,530 A | 3/1999 | Aronowitz et al. | |
| 5,907,177 A | 5/1999 | Uda et al. | |
| 5,923,962 A | 7/1999 | Ohtani et al. | |
| 5,946,561 A | 8/1999 | Yamazaki et al. | |
| 5,949,107 A | 9/1999 | Zhang | |
| 6,001,714 A | 12/1999 | Nakajima et al. | |
| 6,030,667 A | 2/2000 | Nakagawa et al. | |
| 6,046,474 A | 4/2000 | Oh et al. | |
| 6,093,457 A | 7/2000 | Okumura et al. | |
| 6,115,094 A | 9/2000 | Fukunaga | |
| 6,153,445 A | 11/2000 | Yamazaki et al. | |
| 6,153,893 A | 11/2000 | Inoue et al. | |
| 6,166,414 A | 12/2000 | Miyazaki et al. | |
| 6,168,958 B1 | 1/2001 | Gardner et al. | |
| 6,172,671 B1 | 1/2001 | Shibuya et al. | |
| 6,198,133 B1 | 3/2001 | Yamazaki et al. | |
| 6,207,995 B1 | 3/2001 | Gardner et al. | |
| 6,215,154 B1 | 4/2001 | Ishida et al. | |
| 6,246,070 B1 | 6/2001 | Yamazaki et al. | |
| 6,255,705 B1 | 7/2001 | Zhang et al. | |
| 6,281,552 B1 | 8/2001 | Kawasaki et al. | |
| 6,380,561 B1 | 4/2002 | Ohtani et al. | |
| 6,400,426 B1 | 6/2002 | Yamazaki et al. | |
| 6,515,336 B1 * | 2/2003 | Suzawa | G02F 1/13454 257/347 |
| 6,541,294 B1 | 4/2003 | Yamazaki et al. | |
| 6,639,265 B2 | 10/2003 | Arao et al. | |
| 6,646,287 B1 | 11/2003 | Ono et al. | |
| 6,664,145 B1 | 12/2003 | Yamazaki et al. | |
| 6,909,114 B1 | 6/2005 | Yamazaki | |
| 6,967,696 B2 | 11/2005 | Yamazaki et al. | |
| 7,224,028 B2 * | 5/2007 | Suzawa | H01L 27/1214 257/223 |
| 7,589,382 B2 * | 9/2009 | Suzawa | H01L 27/1214 257/347 |
| 7,675,583 B2 | 3/2010 | Yamazaki et al. | |
| 2010/0134709 A1 | 6/2010 | Yamazaki et al. | |

FOREIGN PATENT DOCUMENTS

| | | | | |
|---|---|---|---|---|
| JP | 4-369271 | 12/1992 | | |
| JP | 5-102483 | 4/1993 | | |
| JP | 6-148685 | 5/1994 | | |
| JP | 7-130652 | 5/1995 | | |
| JP | 7-235680 | 9/1995 | | |
| JP | 8-78329 | 3/1996 | | |
| JP | 8-274336 | 10/1996 | | |
| JP | 9-55508 | 2/1997 | | |
| JP | 9-191111 | 7/1997 | | |
| JP | 9-279367 | 10/1997 | | |
| JP | 9-293600 | 11/1997 | | |
| JP | 10-92576 | 4/1998 | | |
| JP | 10-104659 | 4/1998 | | |
| JP | 10-125928 | 5/1998 | | |
| JP | 10-135468 | 5/1998 | | |
| JP | 10-135469 | 5/1998 | | |
| JP | H10-125928 | * 5/1998 | ............ | H01L 29/78 |
| JP | 10-233511 | 9/1998 | | |
| JP | 10-288797 | 10/1998 | | |
| JP | 10-294280 | 11/1998 | | |
| JP | 10-341020 | 12/1998 | | |
| JP | 11-191628 | 7/1999 | | |
| JP | 11-345767 | 12/1999 | | |
| JP | 11-354442 | 12/1999 | | |
| WO | WO 90/13148 A1 | 11/1990 | | |

OTHER PUBLICATIONS

Shimokawa, R. et al, "Characterization of High-Efficiency Cast-Si Solar Cell Wafers by MBIC Measurement," Japanese Journal of Applied Physics, vol. 27, No. 5, May 1988, pp. 751-758.

Hatano, M. et al, "A Novel Self-Aligned Gate-Overlapped LDD Poly-Si TFT with High Reliability and Performance," IEEE, IEDM-97, Dec. 1997, pp. 523-526.

Schenk, H. et al, "Polymers for Light Emitting Diodes," Eurodisplay '99, Proceedings of the 19⁻International Display Research Conference, Berlin, Germany, Sep. 6-9, 1999, pp. 33-37.

* cited by examiner

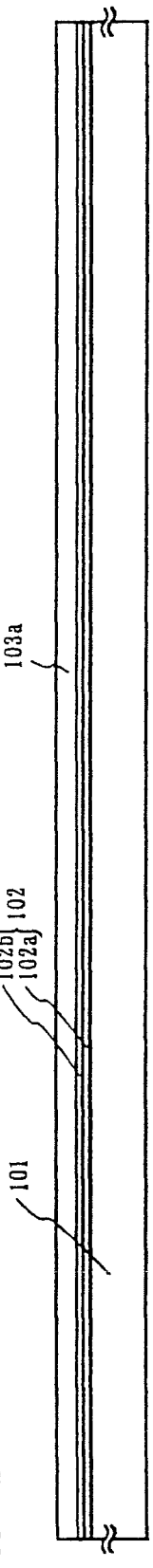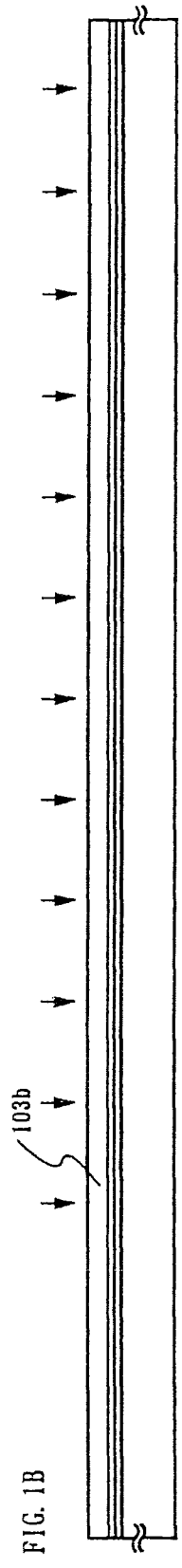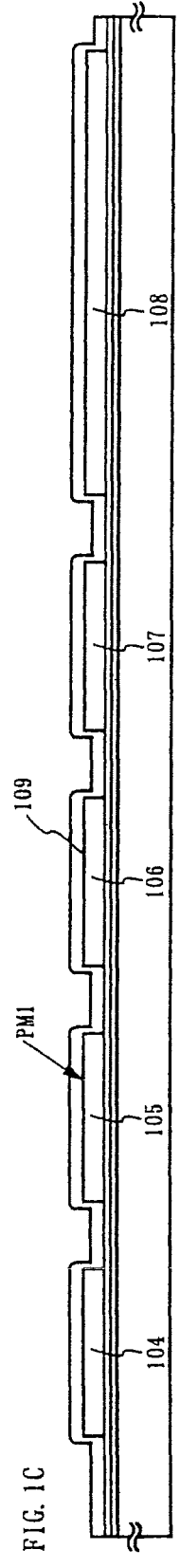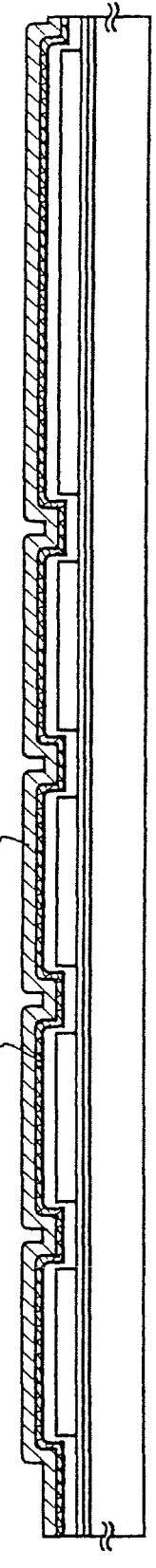

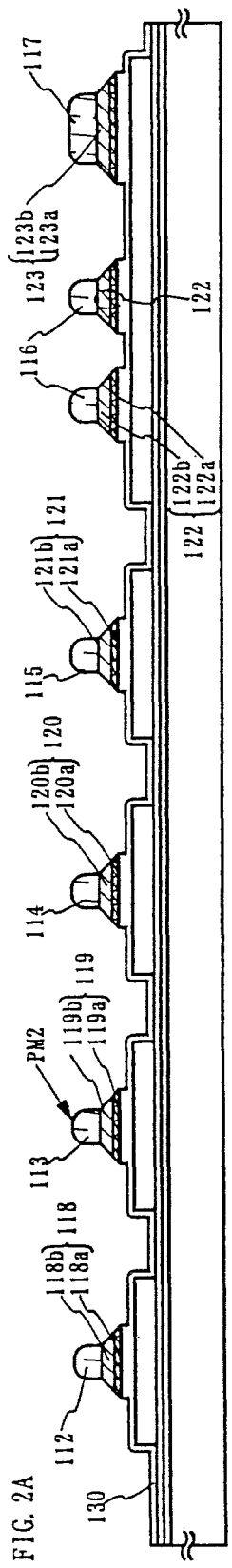
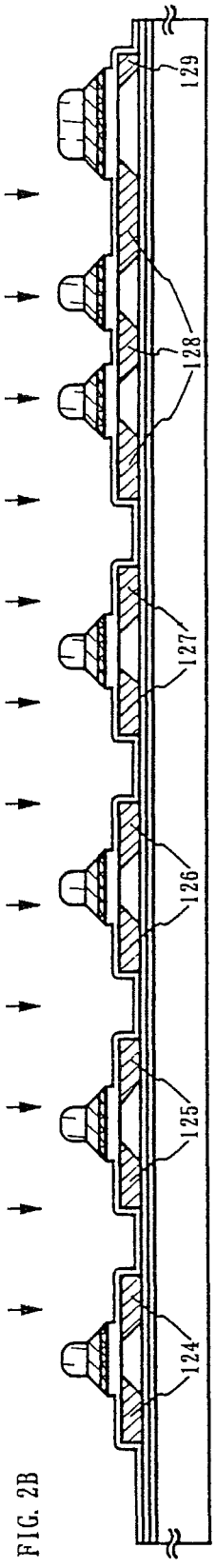
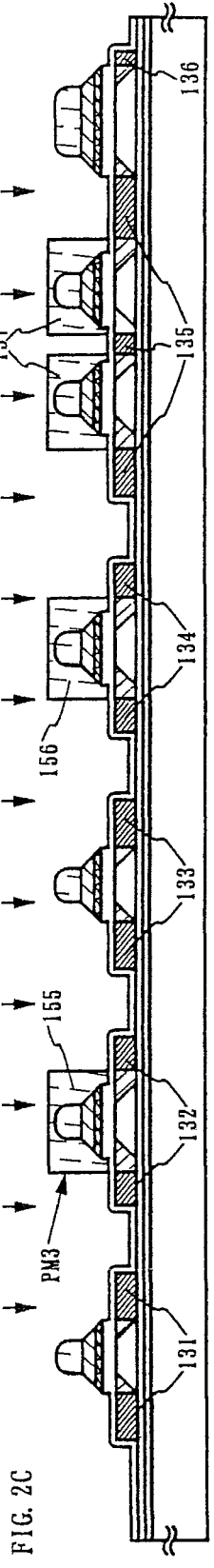
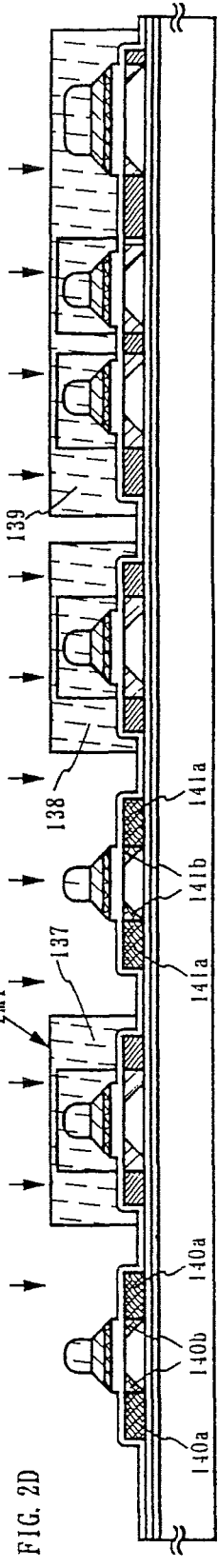
FIG. 2A
FIG. 2B
FIG. 2C
FIG. 2D

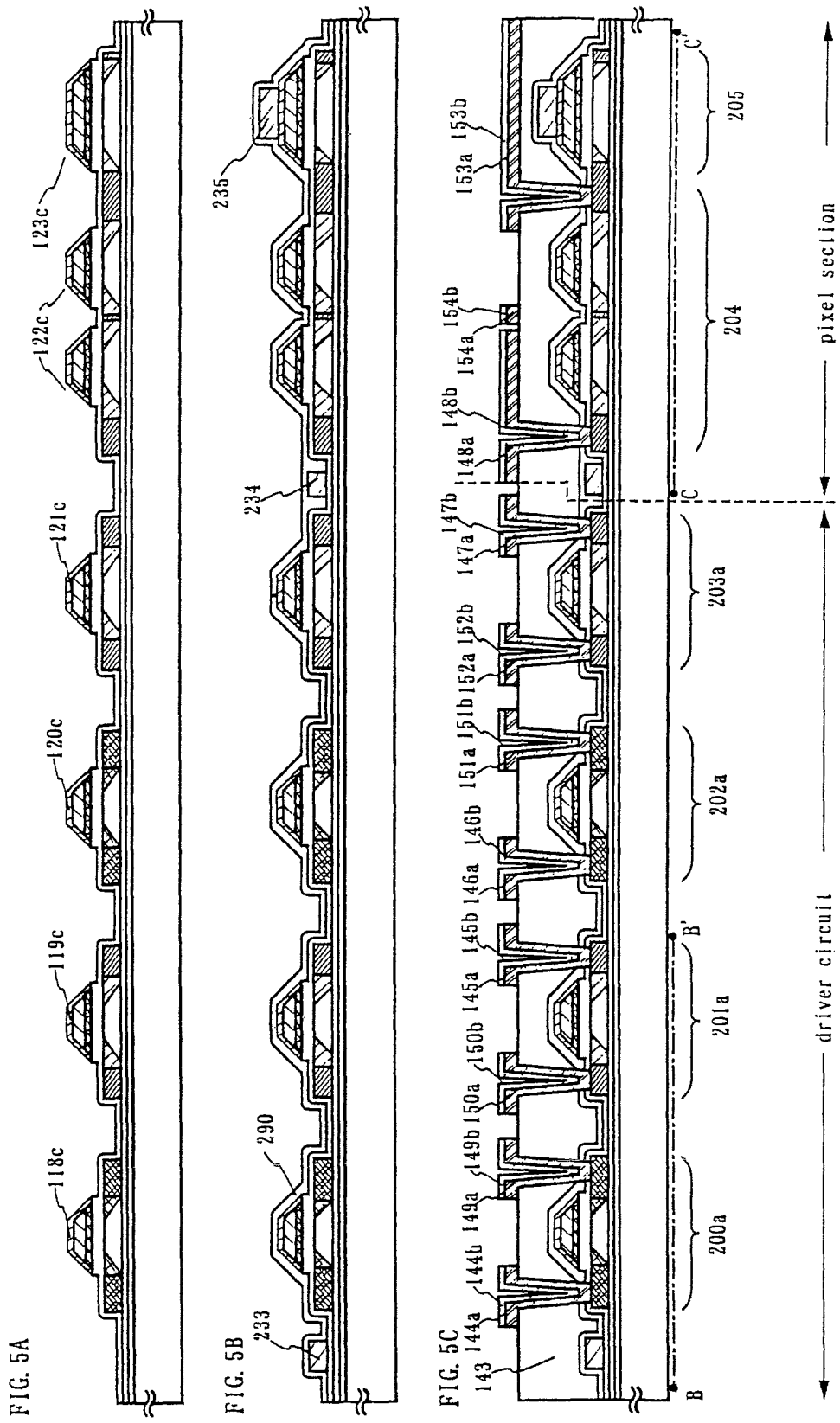

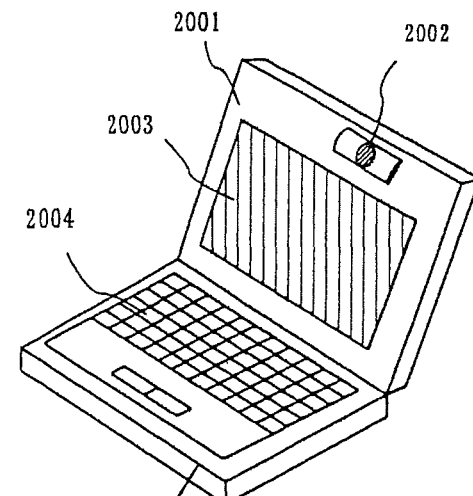
FIG. 22A
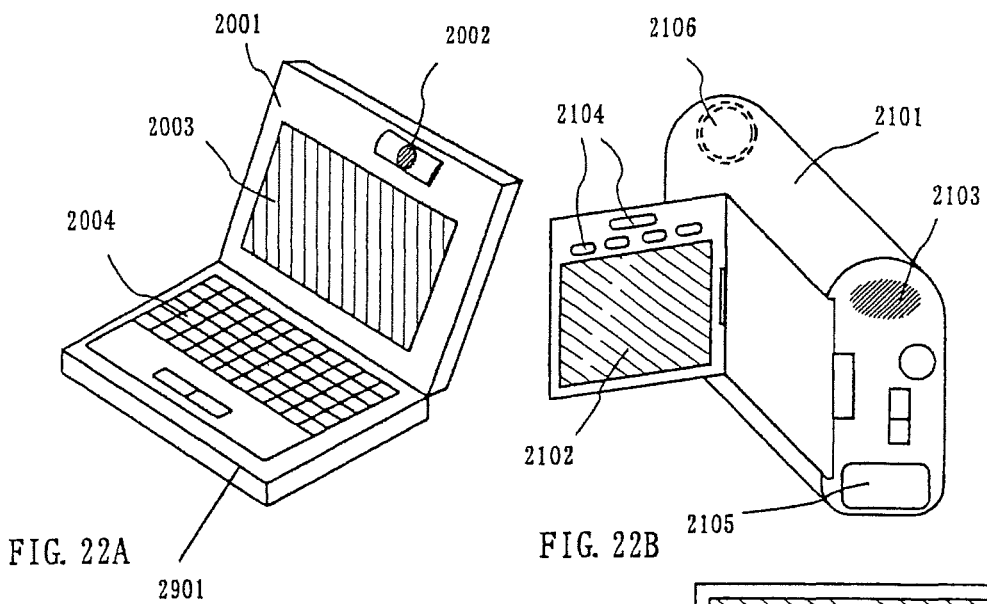
FIG. 22B
FIG. 22C
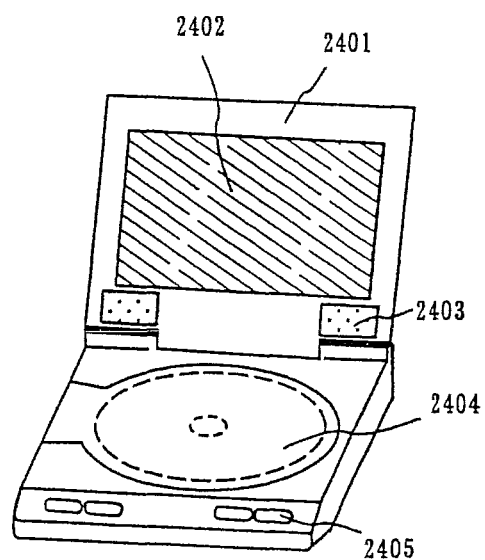
FIG. 22D
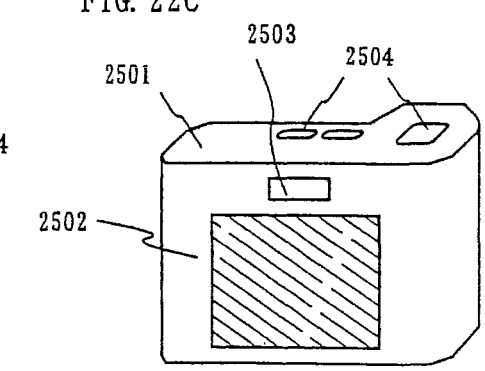
FIG. 22E magnification ×15,000 bias power 128mW/cm² magnification ×15,000 bias power 192mW/cm² magnification ×15,000 bias power 256mW/cm²

SEMICONDUCTOR DEVICE HAVING A GATE INSULATING FILM WITH THICK PORTIONS ALIGNED WITH A TAPERED GATE ELECTRODE

This application is a continuation of U.S. application Ser. No. 13/169,224 filed on Jun. 27, 2011 which is a continuation of U.S. application Ser. No. 12/009,754 filed on Jan. 22, 2008 (now U.S. Pat. No. 7,968,890 issued Jun. 28, 2011) which is a continuation of U.S. application Ser. No. 10/848,189 filed on May 18, 2004 (now U.S. Pat. No. 7,335,911 issued Feb. 26, 2008) which is a divisional of U.S. application Ser. No. 10/337,704, filed on Jan. 7, 2003 (now U.S. Pat. No. 6,743,649 issued Jun. 1, 2004) which is a divisional of U.S. application Ser. No. 09/618,930, filed on Jul. 18, 2000 (now U.S. Pat. No. 6,541,294 issued Apr. 1, 2003).

BACKGROUND OF THE INVENTION

1. Field of the Invention

The present invention relates to a semiconductor device having a circuit comprising a thin film transistor (hereinafter referred to as TFT) formed over a substrate having an insulating surface and to a method of manufacturing the same. More particularly, the present invention provides a technique suitable for use in an electro-optical device, typically a liquid crystal display device having a pixel portion and a driver circuit provided in the periphery of the pixel portion over the same substrate, and electronic equipment incorporating the electro-optical device. Note that in the present specification, the semiconductor device indicates general devices that may function by use of semiconductor characteristics, and the above electro-optical device and the electronic equipment incorporating the electro-optical device are categorized as the semiconductor device.

2. Description of the Related Art

In the electro-optical device, typically an active matrix type liquid crystal display device, a technique in which a TFT is utilized for the purpose of structuring a switching element and an active circuit has been developed. A TFT uses a semiconductor film formed on a substrate such as a glass substrate by vapor phase growth as an active layer. A material such as silicon or silicon germanium having silicon as its principal constituent is suitably utilized in the semiconductor film. The semiconductor film as such can be classified into an amorphous silicon film or a crystalline silicon film, typically a polycrystalline silicon film, depending on the manufacturing method of the semiconductor film.

The TFT that uses an amorphous semiconductor (typically an amorphous silicon) film as an active layer cannot attain an electric field effect mobility of several $cm^2$/Vsec or more because of electronic physical properties originated in the amorphous structure, or the like. Due to this, in an active matrix type liquid crystal display device, despite being available for use as the switching element (hereinafter referred to as pixel TFT) for driving the liquid crystals in the pixel portion, the TFT using the amorphous semiconductor as the active layer has been unusable in forming a driver circuit for performing image display. Accordingly, a technique in which a driver IC utilized as the driver circuit is mounted by the TAB (Tape Automated Bonding) method or the COG (Chip On Glass) method has been employed.

On the other hand, a TFT using a semiconductor film containing a crystal structure (hereinafter referred to as crystalline semiconductor film) (typically crystalline silicon or polycrystalline silicon) as the active layer is capable of attaining high electric field effect mobility, making it possible to form various functional circuits over the same glass substrate. Besides the pixel TFT, in the driver circuit, forming other circuits on the same substrate such as a shift register circuit, a level shifter circuit, a buffer circuit, and a sampling circuit has been realized. Such circuits are formed by using a CMOS circuit as a base circuit, which comprises an n-channel TFT and a p-channel TFT. Supported by this technique in mounting these kinds of driver circuits, it has become clear that a TFT using as an active layer a crystalline semiconductor layer that is capable of forming driver circuits in addition to the pixel portion over the same substrate is suitable for promoting reduction in weight and thickness of a liquid crystal display device.

When comparing TFTs from their characteristics, the TFT that uses the crystalline semiconductor layer as the active layer is superior. However, in order to manufacture TFTs corresponding to the various circuits other than the pixel TFT, there is a problem in that the manufacturing process becomes a complicated one, thereby increasing the number of steps. This increase in number of steps is not only a factor in the increase in production costs, but apparently also is the cause in reducing yield.

The operating conditions of the pixel TFT and the TFTs of the driver circuits are not always the same. On account of this, the characteristics that are required of a TFT are quite different. The pixel TFT is formed of the n-channel TFT and drives, as a switching element, a liquid crystal by applying a voltage to the liquid crystal. The liquid crystal is driven by an alternate current, thus a method called frame inversion driving is widely adopted. In this method, for the purpose of suppressing the power consumption low, the characteristic that is demanded of the pixel TFT is to sufficiently lower an off current value (a drain current that flows during an off-operation of the TFT). On the other hand, since a high driver voltage is applied to the buffer circuit of the driver circuit and other circuits thereof, it is necessary to raise the withstand voltage of the TFT so that it will not break when a high voltage is applied. Also, in order to make the current drive ability higher, it is necessary to sufficiently secure an on current value (a drain current that flows during an on-operation of the TFT).

As a structure of the TFT to reduce the off-current value, a low concentration drain (LDD: Lightly Doped Drain) structure is known. In this structure, there is provided a region that is doped with an impurity element at a low concentration between a channel forming region and a source region or a drain region that is formed by doping an impurity element at a high concentration, and this region is called the LDD region. Further, as a means of preventing the degradation of the on current value caused by a hot carrier, a so-called GOLD (Gate-drain Overlapped LDD) structure is known in which the LDD region is arranged so as to overlap a gate electrode via a gate insulating film. With a structure as such, the high electric field in the vicinity of a drain is alleviated, thereby preventing hot carrier injection, a known effective prevention of the degradation phenomenon.

However, there is another point that must be given attention to besides the above off current value and the on current value. For example, the bias state of the pixel TFT and the TFT of the driver circuit such as the shift resist circuit or the buffer circuit is not necessarily the same. For example, in the pixel TFT, a large reverse bias (a negative voltage in an n-channel TFT) is applied to a gate, whereas the TFT of the driver circuit basically does not operate in the reverse bias state. Also, regarding the operating velocity, the pixel TFT may be $\frac{1}{100}$ or less than that of the TFT of the driver circuit.

The GOLD structure is highly effective in preventing the deterioration of the on current value, but on the other hand, there arises a problem in that the off current value becomes higher compared with the usual structure of an LDD. Therefore, the GOLD structure is not a preferred structure for applying to the pixel TFT. Contrarily, although the usual structure of the LDD is highly effective in suppressing the off current value, it has a low effect in relaxing the electric field in the vicinity of a drain and in preventing deterioration caused by the hot carrier injection. It is thus not always preferable to form all TFTs to have the same structure in a semiconductor device that has a plurality of integrated circuits different from one another in the operation condition, as in active matrix liquid crystal display device. The problem as such becomes apparent especially as the characteristics of crystalline silicon TFTs are enhanced and more is demanded for the performance of active matrix liquid crystal display devices.

Further, in order to stabilize the operations of these circuits to be manufactured by using the n-channel TFT and the p-channel TFT, it is necessary to set values such as the threshold voltage of the TFT and the sub-threshold coefficient (S value) within a predetermined range. In order to do this, it is necessary to examine the TFTs from both the viewpoint of the structure and the viewpoint of the materials constituting the structure.

SUMMARY OF THE INVENTION

A technique of the present invention is for solving the above problems, and an object of the present invention is to improve operation characteristics and reliability of a semiconductor device by optimizing the structure of TFTs arranged in various circuits of the semiconductor device and an electro-optical device, typically an active matrix liquid crystal display device, formed by using the TFT, in accordance with the function of the respective circuits. In addition, another object of the present invention is to realize low power consumption as well as decreasing the number of steps to thereby reduce production costs and improve yield.

Reducing the number of manufacturing steps is one of means to realize the reduction of production costs and improvement in yield. Specifically, it is necessary to reduce the number of photomasks required for manufacturing a TFT. In the photolithography technique, the photomask is used for forming a resist pattern over a substrate as a mask of the etching process. Accordingly, the use of one photomask means that other processes such as the removal of resists and the cleaning and drying process are added to the processes of the film deposition and of the etching in the steps before and after the step where the photomask is used. It also means that complicated processes such as resist coating, pre-bake, exposure, development, and post-bake in the photolithography technique are performed.

Thus, while reducing the number of photomasks, appropriate structures of TFTs arranged in various circuits are formed in accordance with the respective circuits. Specifically, it is desired that in the structure of a TFT for functioning as a switching element, importance be placed on reducing the off current value rather than the operating speed. A multi-gate structure is adopted as such a structure. On the other hand, the structure of a TFT to be provided in the driver circuit in which high speed operation is required, it is desired that importance be placed on increasing the operating speed, and at the same time, on repressing degradation caused by hot carrier injection, which becomes a serious problem as the operating speed is increased. Various ideas have been added to the LDD region of the TFT to construct such a structure. In other words, the LDD region provided between the channel forming region and the drain region is characterized by having a concentration gradient in which the concentration of conductivity controlling impurity element gradually rises as it nears the drain region. This structure is remarkably effective in relaxing the electric field that will concentrate in a depletion layer in the vicinity of the drain region.

In order to form the LDD region having the concentration gradient of an impurity element as such, the present invention employs a method of doping an ionized conductivity controlling impurity element accelerated in the electric field to thereby penetrate through a gate electrode and a gate insulating film (the present invention defines the gate insulating film as the gate insulating film provided between the gate electrode and the semiconductor layer and in contact therewith and including the insulating film extending from the gate insulating film into a region in the periphery of the gate insulating film) and to be doped into a semiconductor layer. It should be noted that throughout the present specification, this doping method of impurity element is referred to as "the through doping method" for the sake of convenience. Furthermore, the shape of the gate electrode in the through doping method of the present invention is the so-called taper shape, meaning that the thickness of the gate electrode gradually increases inward from an edge portion. Performing the through doping method with the gate electrode having the taper shape makes it possible to control the concentration of the impurity element doped in the semiconductor layer by adjusting the thickness of the gate electrode. Hence, the LDD region in which the concentration of the impurity element gradually varies along the channel length direction of the TFT can be formed.

The material used for forming the gate electrode is a heat-resistant conductive material formed from an element chosen from the group consisting of tungsten (W), tantalum (Ta), and titanium (Ti), or a compound or an alloy having the above elements as a constituent. Speedy and precise etching is performed on such heat-resistant conductive materials, and to further form the edge portion into a taper shape, dry etching using high-density plasma is applied. As a means of achieving high-density plasma, an etching apparatus that utilizes a microwave or ICP (Inductively Coupled Plasma) is suitable. Particularly, the ICP etching apparatus can easily control plasma as well as deal with the operation of processing a large area surface substrate.

References to the plasma treatment method and to the plasma treatment apparatus utilizing the ICP are disclosed in Japanese Patent Application Laid-open No. Hei 9-293600. In this application, as a means for performing high precision plasma treatment, a method of forming plasma by applying high frequency electric power to a multi-spiral coil formed from 4 whirlpool shaped coil parts connected in series via an impedance matching apparatus is utilized.

The length of each of the whirlpool shaped coil parts is set to be ¼ times that of the wavelength of the high frequency. In addition, the plasma treatment apparatus is structured such that a different high frequency electric power is also applied to a lower electrode for holding the piece to be treated to thereby add a bias voltage.

FIG. 19A schematically shows the structure of such a plasma treatment apparatus (for example, an etching apparatus) using ICP. An antenna coil 903 is arranged on a quartz substrate 905 in the upper portion of the reaction space, and the antenna coil 903 is connected to a first high frequency power source 901 through a matching box 907. The first high frequency power source 901 is set to between 6 and 60 MHz, typically 13.56 MHz. Further, a second high frequency power source 902 is connected through a matching box 912 to a lower electrode 904 that holds a substrate 906 which is the piece to be processed. The second high frequency power source 902 is set to between 100 kHz and 60 MHz (for example between 6 and 29 MHz). If a high frequency electric power is applied to the antenna coil 903, then a high frequency current J flows in the θ direction in the antenna coil 903 and a magnetic field B develops in the Z direction (Equation 1). An induced electric field E develops in the θ direction in accordance with Faraday's law of electromagnetic induction (Equation 2).

$$\mu_0 J = rot B \quad \text{(Equation 1)}$$

$$-\frac{\partial B}{\partial t} = rot E \quad \text{(Equation 2)}$$

Electrons are accelerated in the θ direction in the induced electric field E and collide with gas molecules, generating plasma. The direction of the induced electric field is the θ direction, and therefore the probability of energy disappearing by charged particles colliding with the reaction chamber walls and the substrate is reduced. Further, there is almost no magnetic field B downstream of the antenna coil 903, and consequently a high density plasma region spread out in a sheet shape is formed. By regulating the high frequency electric power applied to the lower electrode 904, it is possible to independently control the plasma density and the bias voltage applied to the substrate 906. Further, it is also possible to vary the frequency of the applied high frequency electric power in response to the material of the piece to be processed.

In order to obtain a high density plasma with the ICP etching apparatus, it is necessary for the high frequency current J to flow with little loss, hence the inductance of the antenna coil 903 must be reduced. For this purpose, a method of partitioning the antenna coil is effective. FIG. 19B is a diagram showing such type of structure. On a quartz substrate 911, 4 whirlpool shaped coils 910 (multi-spiral coils) are arranged and connected to the first high frequency power source 908 via a matching box 909. At this point, a peak value of the voltage that is generated can be made higher by setting the length of each coil to a value that is a plus multiple of a quarter of the wavelength of the high frequency so as to generate a stationary wave in the coils.

If the etching apparatus using the ICP to which such multi-spiral coil is applied is employed, then the etching of the heat-resistant conductive materials may be performed well. A dry etching apparatus using the multi-spiral ICP of Matsushita Electric Corp. (model E645-ICP) is employed here. Shown in FIGS. 20A and 20B are the results of examining the taper shape of the patterned edge portion of a W film, which has been formed into a given pattern on the glass substrate. Here, the angle of the taper portion is defined as the angle of the inclination portion of the taper portion and the substrate surface (level surface) (the angle indicated by θ1 in FIG. 4). As common conditions, the electric discharge power (high frequency power to be applied to the coil, 13.56 MHz) is set to 3.2 W/cm², the pressure is set to 1.0 Pa, and $CF_4$ and $Cl_2$ are used as the etching gas. FIG. 20A shows the dependency of the angle of the taper portion on the bias power (13.56 MHz) to be applied to the substrate. The flow rate of the etching gas $CF_4$ and $Cl_2$ are both set to 30 SCCM. It has become apparent that the angle of the taper portion can be altered between 70° and 20° within a range of the bias power 128 to 384 mW/cm².

FIGS. 24A to 24C are electron microscope photographs showing the shape of the etched W film. FIGS. 24A, 24B, and 24C are photographs showing cases where a bias power applied to the substrate is 128 mW/cm², 192 mW/cm², and 256 mW/cm², respectively. As is apparent from FIG. 20A, the angle of the taper portion becomes smaller as the bias power applied to the substrate becomes higher.

Further, FIG. 20B shows the results of examining the dependency of the angle of the taper portion on the flow rate ratio of the etching gas. The flow rate of $CF_4$ is altered in a range of from 20 to 40 SCCM with the condition that the total flow rate of $CF_4$ and $Cl_2$ is set to 60 SCCM. The bias power at this point is set to 128 mW/cm². Consequently, it is possible to alter the angle of the taper portion from 60° to 80°.

As is shown here, the angle of the taper portion is greatly altered by the amount of bias power applied to the substrate. Accordingly, the angle of the taper portion can be altered to between 5° and 45° by further increasing the bias power, and also by changing the pressure.

The processing characteristics in the ICP etching apparatus for the heat-resistant conductive material that forms the gate electrode is shown in Table 1. Besides the W film and a Ta film, an example of a molybdenum-tungsten (Mo—W) alloy (composition ratio is Mo:W=48:50 wt %) that is often used as the material for the gate electrode, is shown here. Table 1 shows typical values of the etching speed, the applicable etching gas, and the selective ratio of the material to a gate insulating film that is a base of the gate electrode. The gate insulating film is a silicon oxide film or a silicon oxynitride film formed by plasma CVD. The selective ratio here is defined as the ratio of the etching speed of the gate insulating film to the etching speed of each material.

TABLE 1

| Material | Etching speed (nm/min) | Selective ratio to the gate insulating film | Etching gas |
|---|---|---|---|
| W | 70-90 | 2-4 | $CF_4 + Cl_2$ |
| Ta | 140-160 | 6-8 | $Cl_2$ |
| Mo—W | 40-60 | 0.1-2 | $CF_4 + Cl_2$ |

The etching speed of the Ta film is between 140 and 160 nm/min, and the selective ratio is selected from between 6 and 8. This value is superior to the value of the selective ratio between 2 and 4 of the W film with the etching speed between 70 and 90 nm/min. Therefore, the Ta film is also applicable from the viewpoint of the characteristic of the workability. Although not shown in the table, the resistivity of the Ta film is between 20 and 30 μΩcm compared with the resistivity of the W film, which is between 10 and 16 Ωcm. Hence, the Ta film resistivity is relatively higher resulting in its drawback. On the other hand, the etching speed of the Mo—W alloy is slow, between 40 and 60 nm/min, and its selective ratio is between 0.1 and 2. It can be seen from the viewpoint of the characteristic of the workability that this material is not always suitable. As can be known from Table 1, the Ta film shows the best results. However, as stated above, when the resistivity is taken into consideration, then it is determined that the W film is suitable after considering all the factors.

Although an example of the W film has been shown here, a patterned edge portion can be easily processed into a taper shape by utilizing the ICP etching apparatus in regards to the above heat-resistant conductive materials. In addition, by applying such method to provide the gate electrode and then performing the through dope method makes it possible to control the concentration of the impurity element doped in the semiconductor layer through adjustment of the thickness of the gate electrode. Hence, the LDD region in which the concentration of the impurity element gradually varies along the channel length direction of the TFT can be formed.

With the employment of such means, according to one aspect of the present invention, there is provided a semiconductor device comprising a pixel TFT formed in a pixel portion and a driver circuit comprising a p-channel TFT and an n-channel TFT formed in the periphery of the pixel portion over the same substrate, characterized in that:

the n-channel TFT of the driver circuit has a gate electrode having a taper portion, a channel forming region, a first impurity region for forming an LDD region provided so as to partly overlap the gate electrode as well as in contact with the channel forming region, and a second impurity region for forming a source region or a drain region provided outside the first impurity region;

the p-channel TFT of the driver circuit has a gate electrode having a taper portion, a channel forming region, a third impurity region for forming an LDD region provided so as to overlap the gate electrode as well as in contact with the channel forming region, and a fourth impurity region for forming a source region or a drain region provided outside the third impurity region;

the pixel TFT has a gate electrode having a taper portion, a channel forming region, a first impurity region for forming an LDD region provided so as to partly overlap the gate electrode as well as in contact with the channel forming region, and a second impurity region for forming a source region or a drain region provided outside the first impurity region;

wherein a concentration of an impurity element of one conductivity in the region overlapping the gate electrode in the first impurity region and a concentration of an impurity element of opposite conductivity in the third impurity region become higher as it goes distant from the channel forming regions to which the respective impurity regions contact; and a pixel electrode provided in the pixel portion has a light reflective surface, is formed on a second interlayer insulating film made of an organic insulating material, and is connected to the pixel TFT via an opening provided at least in a first interlayer insulating film made of an inorganic insulating material formed above the gate electrode of the pixel TFT and in the second interlayer insulating film formed in contact with the top surface of the first interlayer insulating film, or a pixel electrode provided in the pixel portion has light transitivity, is formed on a second interlayer insulating film made of an organic insulating material, and is connected to a conductive metallic wiring to be connected to the pixel TFT, the conductive metallic wiring is formed via an opening provided at least in a first interlayer insulating film made of an inorganic insulating material formed above the gate electrode of the pixel TFT and in the second interlayer insulating film formed in contact with the top surface of the first interlayer insulating film.

Further, according to another aspect of the present invention, there is provided a semiconductor having liquid crystal held between a pair of substrates, characterized in that:

one substrate which has a pixel TFT disposed in the pixel section and a driver circuit comprising a p-channel TFT and an n-channel TFT disposed in the periphery of the pixel section comprises:

an n-channel TFT of the driver circuit has a gate electrode having a taper portion, a channel forming region, a first impurity region for forming an LDD region provided so as to partly overlap the gate electrode as well as in contact with the channel forming region, and a second impurity region for forming a source region or a drain region provided outside the first impurity region;

a p-channel TFT of the driver circuit has a gate electrode having a taper portion, a channel forming region, a third impurity region for forming an LDD region provided so as to overlap the gate electrode as well as in contact with the channel forming region, and a fourth impurity region for forming a source region or a drain region provided outside the third impurity region;

the pixel TFT has a gate electrode having a taper portion, a channel forming region, a first impurity region for forming an LDD region provided so as to partly overlap the gate electrode as well as in contact with the channel forming region, and a second impurity region for forming a source region or a drain region provided outside the first impurity region;

a concentration of an impurity element of one conductivity in the first impurity region and a concentration of an impurity element of opposite conductivity in the portion which overlaps the gate electrode of the third impurity region become higher as it gets distant from the channel forming regions to which the respective impurity regions are adjoined;

wherein, a pixel electrode provided in the pixel portion has a light reflective surface, is formed on a second interlayer insulating film made of an organic insulating material, and is connected to the pixel TFT via an opening provided at least in a first interlayer insulating film made of an inorganic insulating material formed above the gate electrode of the pixel TFT and in the second interlayer insulating film formed in contact with the top surface of the first interlayer insulating film; and the one substrate is bonded to the other substrate having a transparent conductive film formed thereon via at least one column-shape spacer formed overlapping the opening provided in the first interlayer insulating film and the second interlayer insulating film, or the pixel electrode provided in the pixel portion has light transitivity, is formed on a second interlayer insulating film made of an organic insulating material, and is connected to a conductive metallic wiring to be connected to the pixel TFT, the conductive metallic wiring is formed via an opening provided at least in a first interlayer insulating film made of an inorganic insulating material formed above the gate electrode of the pixel TFT and in the second interlayer insulating film formed in contact with the top surface of the first interlayer insulating film; and the one substrate is bonded to the other substrate having a transparent conductive film formed thereon via at least one column-shape spacer formed overlapping the opening provided in the first interlayer insulating film and the second interlayer insulating film. The angle of the taper portion of the gate electrode is set between 5° and 45°.

According to another aspect of the present invention, there is provided a method of manufacturing a semiconductor device having a pixel TFT formed in a pixel portion and a driver circuit, having a p-channel TFT and a n-channel TFT, formed in the periphery of the pixel portion on the same substrate, the method is characterized by comprising:

a first step of forming a semiconductor layer containing a crystal structure over the substrate;

a second step of forming a plurality of island semiconductor layers by selectively etching the semiconductor layer containing a crystal structure;

a third step of forming a gate insulating film in contact with the island semiconductor layers;

a fourth step of forming a conductive layer made of a heat-resistant conductive material over the gate insulating film;

a fifth step of foiling a gate electrode having a taper portion by selectively etching the conductive layer;

a sixth step of forming a first impurity regions having a concentration gradient of an impurity element that imparts n-type conductivity in a direction parallel to the substrate by doping the impurity element that imparts n-type conductivity at least into the island semiconductor layers that form the n-channel TFT of the driver circuit and the pixel TFT, through the taper portion of the gate electrode and through the gate insulating film;

a seventh step of forming a second impurity regions by doping an impurity element that imparts n-type conductivity into the island semiconductor layers that form the n-channel TFT of the driver circuit and the pixel TFT, by forming a mask over the gate electrode and over the region adjacent to the gate electrode;

an eighth step of forming third impurity regions having a concentration gradient of an impurity element that imparts p-type conductivity in a direction parallel to the substrate by doping the impurity element that imparts p-type conductivity into the island semiconductor layer that forms the p-channel TFT of the driver circuit through the taper portion of the gate electrode and through the gate insulating film, and of forming at the same time a fourth impurity region by doping an impurity element that imparts p-type conductivity, but not via the taper portion of the gate electrode;

a ninth step of forming a first interlayer insulating film made of an inorganic insulating material above the n-channel TFT and the p-channel TFT of the driver circuit, and the pixel TFT;

a tenth step of forming a second interlayer insulating film made of an organic insulating material in contact with the first interlayer insulating film; and an eleventh step of forming a pixel electrode having a light reflective surface to be connected to the pixel TFT, on the second interlayer insulating film. Or a step of forming the pixel electrode with a transparent conductive film and connecting it to the conductive metallic wiring that is to be connected to the pixel TFT may be applied.

According to another aspect of the present invention, there is provided a method of manufacturing a semiconductor device having liquid crystal held between a pair of substrates, said method characterized by comprising:

a first step of forming, on one substrate, a semiconductor layer containing a crystal structure, the one substrate having a pixel TFT formed in a pixel portion and a driver circuit having an n-channel TFT and a p-channel TFT formed in the periphery of the pixel portion;

a second step of forming a plurality of island semiconductor layers by selectively etching the semiconductor layer containing a crystal structure;

a third step of forming a gate insulating film in contact with the island semiconductor layers;

a fourth step of forming a conductive layer made of a heat-resistant conductive material over the gate insulating film;

a fifth step of forming gate electrodes having a taper portion by selectively etching the conductive layer;

a sixth step of forming first impurity regions having a concentration gradient of an impurity element that imparts n-type conductivity in a direction parallel to the substrate by doping the impurity element that imparts n-type conductivity at least into the island semiconductor layers that form the n-channel TFT of the driver circuit and the pixel TFT, through the taper portion of the gate electrode and through the gate insulating film;

a seventh step of forming a second impurity region by doping an impurity element that imparts n-type conductivity into the island semiconductor layer that forms the n-channel TFT of the driver circuit and the pixel TFT, by forming a mask over the gate electrode and over the region which is adjacent to the gate electrode;

an eighth step of forming a third impurity region having a concentration gradient of an impurity element that imparts p-type conductivity in a direction parallel to the substrate by doping the impurity element that imparts p-type conductivity into the island semiconductor layer that forms the p-channel TFT of the driver circuit through the taper portion of the gate electrode and through the gate insulating film, and of forming at the same time a fourth impurity region by doping an impurity element that imparts p-type conductivity, but not via the taper portion of the gate electrode;

a ninth step of forming a first interlayer insulating film made of an inorganic insulating material over the n-channel TFT of the driver circuit, the pixel TFT and the p-channel TFT;

a tenth step of forming a second interlayer insulating film made of an organic insulating material in contact with the first interlayer insulating film;

an eleventh step of forming a pixel electrode having a light reflective surface over the second interlayer insulating film to be connected to the pixel TFT via an opening provided in the first interlayer insulating film and in the second interlayer insulating film;

a twelfth step of forming on the other substrate at least a transparent conductive film; and a thirteenth step of bonding the one substrate to the other substrate through at least one column-shape spacer formed overlapping the opening. Or, a step of forming a conductive metallic wiring to be connected to the pixel TFT via an opening provided in the first interlayer insulating film and the second interlayer insulating film, and a step of forming a pixel electrode made from a transparent conductive film on the second interlayer insulating film to be connected to the metallic wiring may be applied.

BRIEF DESCRIPTION OF THE DRAWINGS

In the accompanying drawings:

FIGS. 1A to 1D are sectional views showing steps of manufacturing a pixel TFT and a TFT of a driver circuit;

FIGS. 2A to 2D are sectional views showing steps of manufacturing a pixel TFT and a TFT of a driver circuit;

FIGS. 5A to 5C are sectional views showing steps of manufacturing a pixel TFT and a TFT of a driver circuit;

FIGS. 22A to 22E are diagrams showing examples of a semiconductor device;

DETAILED DESCRIPTION OF THE PREFERRED EMBODIMENTS

Figure 3A:
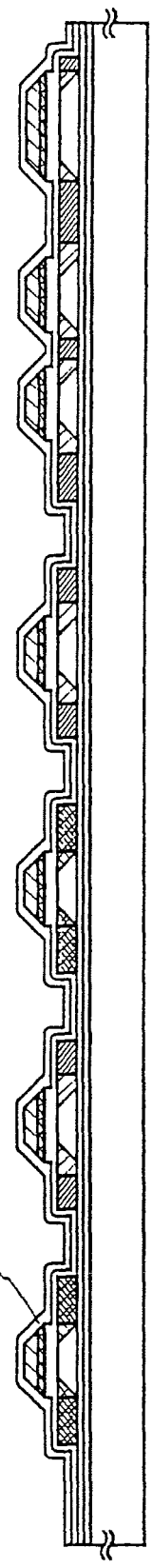
FIGS. 3A to 3C are sectional views showing steps of manufacturing a pixel TFT and a TFT of a driver circuit.

A description of the embodiment modes of the present invention will be explained in detail shown in the following embodiments.

Embodiment 1

Embodiment 1 will be explained with references to FIGS. 1A to 3C. In Embodiment 1, a method of manufacturing a pixel TFT and a storage capacitor of a pixel portion and at the same time; a TFT of a driver circuit that will be provided in the periphery of the pixel portion will be explained in detail in accordance with the process steps.

In FIG. 1A, in addition to the glass substrates such as a barium borosilicate glass or an alumino borosilicate glass, typically the Corning glass #7059 or #1737, plastic substrates that do not have optical anisotropy such as polyethylene terephthalate (PET), polyethylene naphthalate (PEN), and polyether sulfone (PES) may be used for a substrate 101. For the case of using a glass substrate, it may be appropriate to perform heat treatment in advance at a low temperature that is approximately between 10 and 20° C. lower than the distortion point of glass. Then a base film 102 made from an insulating film such as a silicon oxide film, a silicon nitride film, and a silicon oxynitride film, is formed on a surface of the substrate 101 where a TFT will be formed, in order to prevent the diffusion of impurities from the substrate 101. For example, a silicon oxynitride film 102a made from $SiH_4$, $NH_3$, and $N_2O$ at a thickness of between 10 and 200 nm (preferably between 50 and 100 nm) and similarly, a hydrogenated silicon oxynitride film 102b made from $SiH_4$ and $N_2O$ at a thickness of between 50 and 200 nm (preferably between 100 and 150 nm) are formed in lamination by plasma CVD. Though the base film 102 here is shown as a two-layer structure, it may be form as a single layer of the insulating film or as a lamination of 2 or more layers.

The silicon oxynitride film is formed by using a conventional parallel plate type plasma CVD. To prepare the silicon oxynitride film 102a, $SiH_4$ is introduced into the reaction chamber at 10 SCCM, $NH_3$ at 100 SCCM, and $N_2O$ at 20 SCCM, the substrate temperature is set to 325° C., the reaction pressure is set to 40 Pa, the electric discharge power density is set to 0.41 $W/cm^2$, and the electric discharge frequency is set to 60 MHz. On the other hand, to prepare the hydrogenated silicon oxynitride film 102b, $SiH_4$ is introduced into the reaction chamber at 5 SCCM, $N_2O$ at 120 SCCM, and $H_2$ at 125 SCCM, the substrate temperature is set to 400° C., the reaction pressure is set to 20 Pa, the electric discharge power density is set to 0.41 $W/cm^2$, and the electric discharge frequency is set to 60 MHz. These films can be formed in succession by only changing the substrate temperature and changing the reaction gasses.

The silicon oxynitride film 102a formed here has a density of $9.28 \times 10^{22}/cm^3$, and it is a dense, hard film with an etching speed at 20° C. in a mixed solution containing 7.13% ammonium hydrogen fluoride ($NH_4HF_2$) and 15.4% ammonium fluoride ($NH_4F$) (STELLA CHEMIFA Corp; product name LAL500) which is slow at 63 nm/min. If this type of film is used for the base film, then it is effective in preventing diffusion of alkaline metal elements from the glass substrate into a semiconductor layer formed on the base film.

Next, a semiconductor layer 103a having an amorphous structure is formed to a thickness of 25 to 80 nm (preferably between 30 and 60 nm) by a known method such as plasma CVD or sputtering. For example, a 55 nm thick amorphous silicon film is formed by plasma CVD. Amorphous semiconductor layers and microcrystalline semiconductor films exist as semiconductor films having an amorphous structure, and compound semiconductor films having an amorphous structure, such as an amorphous silicon germanium film, may also be applied. Furthermore, both the base film 102 and the amorphous semiconductor layer 103a may be formed in succession. For example, after successively depositing the silicon oxynitride film 102a and the hydrogenated silicon oxynitride film 102b by plasma CVD as stated above, if the reaction gasses are changed from $SiH_4$, $N_2O$, and $H_2$ to $SiH_4$ and $H_2$, or only to $SiH_4$, then the films can be formed successively without once being exposed to the atmosphere. As a result, it becomes possible to prevent contamination of the surface of the hydrogenated silicon oxynitride film 102b, and fluctuation in the characteristics of the manufactured TFTs, and change in the threshold voltage thereof, can be reduced.

Then crystallization step is carried out in which a crystalline semiconductor layer 103b is formed from the amorphous semiconductor layer 103a. Methods such as laser annealing and thermal annealing (solid phase growth methods), or rapid thermal annealing (RTA) are applicable.

Particularly, the laser annealing method is preferably applied for the case of using a substrate as stated above, i.e., the glass substrate and the plastic substrate that is inferior to heat resistance. In the RTA method, a lamp such as an infrared lamp, a halogen lamp, a metal halide lamp, or a xenon lamp is used as a light source. Alternatively, the crystalline semiconductor layer 103b can be formed by a crystallization method using a catalytic element, in accordance with the technique disclosed in Japanese Patent Application Laid-open No. Hei 7-130652. In the crystallization step, first, it is preferable to drive out the hydrogen contained in the amorphous semiconductor layer, and therefore it is desirable to perform heat treatment for approximately one hour at between 400° C. and 500° C., reducing the amount of hydrogen contained in the amorphous semiconductor layer to 5 atomic % or less, and then performing crystallization.

In addition, the amount of hydrogen contained in the amorphous silicon film can be reduced to 5 atomic % or less by using $SiH_4$ and argon (Ar) as the reaction gas and the substrate temperature at 400° C. to 450° C. during film deposition in the process of forming the amorphous silicon film by plasma CVD. In this case, it is not necessary to perform heat treatment for driving out the hydrogen contained in the amorphous silicon film.

When performing crystallization by laser annealing, excimer laser or argon laser of pulse oscillation type, or of continuous light emitting type, is used as the light source. If a pulse oscillation type excimer laser is used, then laser annealing is performed after forming the laser light into a linear shape. The laser annealing conditions may be suitably chosen by the operator, but for example, are set as follows: a laser pulse oscillation frequency of 30 Hz, and a laser energy density of between 100 and 500 $mJ/cm^2$ (typically from 300 to 400 $mJ/cm^2$). The linear shape beam is then irradiated over the entire surface of the substrate, and irradiation is performed so that the overlap ratio of the linear shape beam is between 80 and 98%. The crystalline semiconductor layer 103b as shown in FIG. 1B thus can be formed.

Using a first photomask (PM1), a resist pattern is then formed on the crystalline semiconductor layer 103b by employment of a photolithography technique. Then the crystalline semiconductor layer is partitioned into islands by dry etching to form island semiconductor layers 104 to 108 as shown in FIG. 1C. A mixed gas of $CF_4$ and $O_2$ is used in the dry etching of the crystalline silicon film.

With respect to this type of island semiconductor layers, an impurity element that imparts p-type may be doped into the entire surface of the island semiconductor layers at a concentration of about $1\times10^{16}$ to $5\times10^{17}$ atoms/$cm^3$ in order to control the threshold voltage (Vth) of the TFT. Periodic table group 13 elements such as boron (B), aluminum (Al), and gallium (Ga) are known as impurity elements which impart p-type to a semiconductor. Ion implantation and ion doping (or ion shower doping) can be used as the doping method. The ion doping is suitable for forming a large area substrate as a source gas. Boron (B) is doped here by ion doping using diborane ($B_2H_6$). Doping of impurity elements as such is not always necessary and there is no obstacle in omitting it, but it is a method appropriately used especially for placing the threshold voltage of the n-channel TFT within a predetermined range.

A gate insulating film 109, with a thickness of 40 to 150 nm, is formed from an insulating film containing silicon by using plasma CVD or sputtering. In this embodiment, the gate insulating film 109 is formed at a thickness of 120 nm from the silicon oxynitride film. Furthermore, a silicon oxynitride film that is formed by using $SiH_4$ and $N_2O$ doped with $O_2$ becomes a preferred material to be used here because the fixed electric charge density within the film has been reduced. Of course, the gate insulating film is not limited to this type of silicon oxynitride film. A single layer may be formed from another insulating film containing silicon, or a laminate structure of two or more layers can also be formed for the gate insulating film. For example, in the case of using a silicon oxide film, the silicon oxide film can be formed by plasma CVD in which tetraethyl orthosilicate (TEOS) and $O_2$ are mixed, the reaction pressure is set to 40 Pa, the substrate temperature is set between 300 and 400° C., and electric discharge is conducted at a high frequency (13.56 MHZ) power density of 0.5 to 0.8 $W/cm^2$. Then thermal annealing is performed at between 400° C. and 500° C. on the silicon oxide film thus manufactured, thereby obtaining a good quality gate insulating film.

Next, as shown in FIG. 1D, a heat-resistant conductive layer is formed on the gate insulating film 109 in order to form a gate electrode. A single layer may be formed for this heat-resistant conductive layer, but a laminate structure made up of a plurality of layers such as two layers or three layers can also be formed when necessary. For example, using such heat-resistant conductive materials, the gate electrode may be a laminate structure of a conductive layer (A) 110 made from a conductive metal nitride film and a conductive layer (B) 111 made from a metal film. The conductive layer (B) 111 may be formed from an element selected from the group consisting of Ta, Ti, W, or from an alloy having one of these elements as its principal constituent, or from an alloy film of a combination of these elements. The conductive layer (A) 110 is formed from tantalum nitride (TaN), tungsten nitride (WN), and titanium nitride (TiN). Further, tungsten silicide and titanium silicide may be applied for the conductive layer (A) 110. It is preferred that the concentration of contained impurities be reduced in order to be able to make the resistance of the conductive layer (B) 111 lower, and in particular, it is appropriate to reduce the oxygen concentration to 30 ppm or less. For example, by reducing the oxygen concentration of W to 30 ppm or less, a resistivity value of 20 μΩcm or less can be realized with W.

The conductive layer (A) 110 may be from 10 to 50 nm (preferably 20 to 30 nm) in thickness, and the conductive layer (B) 111 may be from 200 to 400 nm (preferably 250 to 350 nm) in thickness. For the case of using W to form the gate electrode, a WN film of 50 nm in thickness is formed for the conductive layer (A) 110 by sputtering introducing Ar gas and nitrogen ($N_2$) gas, and a W film of 250 nm in thickness is formed for the conductive layer (B) 111. As another method, the W film may also be formed by thermal CVD using tungsten hexafluoride ($WF_6$). In any case, it is necessary to lower the resistance of the W film for use as the gate electrode, the desired resistivity of the W film is 20 μΩcm or less. Growing larger crystal grains in the W film can lower the resistivity. However, crystallization is impeded when many impurity elements such as oxygen, exist in the W, then the W film becomes high resistance. Because of this, a W target having 99.9999% purity is utilized for the case of sputtering, and furthermore, sufficient consideration must be made to prevent an impurity from the vapor from mixing into the films during the deposition of the W film. Accordingly, a resistivity of between 9 and 20 μΩcm can be realized.

On the other hand, when using a TaN film for the conductive layer (A) 110, and Ta film for the conductive layer (B) 111, similarly both films may be formed by sputtering. The TaN film is formed using Ta as a target and a mixed gas of Ar and nitrogen as a sputtering gas. The Ta film is formed using Ar as the sputtering gas. Further, if a suitable amount of Xe or Kr is added to these sputtering gasses, then the internal stresses in the films formed can be relieved, and peeling can be prevented. The resistivity of an α-phase Ta film is about 20 μΩcm and it can be suitably used in the gate electrode, but a β-phase Ta film has a resistivity of about 180 μΩcm and it is unsuitable for the gate electrode. A TaN film possesses a crystal structure which is close to the α-phase, and therefore the α-phase Ta film can be easily obtained provided that a Ta film is formed on the TaN film. Note that although not shown in the figures, it is effective to form a silicon film doped with phosphorus (P), with a thickness of about 2 to 20 nm, below the conductive layer (A) 110. By doing so, along with improving the adhesiveness of the conductive film formed on the silicon film and preventing oxidation, trace amounts of alkaline metal elements contained in the conductive layer (A) 110 or in the conductive layer (B) 111 can be prevented from diffusing into the gate insulating film 109. Whichever is done, it is preferable that the resistivity of the conductive layer (B) 111 be in the range of 10 to 50 μΩcm.

In this embodiment, the conductive layer (A) 110 is formed from the WN film and the conductive layer (B) 111 is formed from the W film in order to form the gate electrode. Next, using a second photomask (PM2), resist masks 112 to 117 are formed by using the photolithography technique. Then the conductive layer (A) 110 and the conductive layer (B) 111 are etched together to form gate electrodes 118 to 122 and a capacitor wiring 123. The gate electrodes 118 to 122 and the capacitor wiring 123 are formed integrally from conductive layers 118a to 122a, made from the conductive layer (A), and from conductive layers 118b to 122b, made from the conductive layer (B). (See FIG. 2A)

At this point, the etching is carried out such that at least taper portions are formed at edge portions of the gate electrodes 118 to 122. The ICP etching apparatus is used in this etching process and the details of this technique are as explained above. Etching is performed at the following specific etching conditions: a mixed gas of $CF_4$ and $Cl_2$ is used as the etching gas, their flow rates are set to 30 SCCM, respectively, the electric discharge power is set to 3.2 W/cm$^2$ (13.56 MHz), the bias power is set to 224 mW/cm$^2$ (13.56 MHz), and the reaction pressure is set to 1.0 Pa. In the edge portions of the gate electrodes 118 to 122, taper portions that gradually increase in thickness inwards from the edge portions are formed under such etching conditions. The angles of these taper portions are 5° to 45°, preferably 10° to 30°. An angle of the taper portions is the angle illustrated in FIG. 4 as θ1. The angle θ1 greatly influences the concentration gradient of a first impurity region for forming LDD regions in a later step. It is to be noted that the angle of the taper portion θ1 is expressed as Tan (θ1)=HG/WG, wherein (WG) is the length of the taper portions and (HG) is the thickness of the taper portions.

Further, in order to perform etching without leaving any residue, it is appropriate to increase the etching time about 10% to 20% to perform over-etching. However, attention must be paid to the selective ratio of etching with a base film at this point. For example, the selective ratio of the silicon oxynitride film (the gate insulating film 109) to the W film as shown in Table 1 is between 2 to 4 (typically 3). Due to this type of over-etching process, an exposed surface of the silicon oxynitride film is etched between 20 and 50 nm, becoming substantially thinner, whereby a newly shaped gate insulating film 130 is formed.

The step of doping an impurity element that imparts n-type conductivity (n⁻ dope process) is performed for the purpose of forming an LDD region of the pixel TFT and an n-channel TFT of the driver circuit. Resist masks 112 to 117, used for the formation of the gate electrode, are kept intact, and using the gate electrodes 118 to 122 having the taper portion in the edge portion, as masks, an impurity element that imparts n-type conductivity is doped by ion doping in a self-aligning manner. Here in this step, in order to dope the impurity element that imparts n-type conductivity so that it passes through the taper portions in the edge portions of the gate electrodes and through the gate insulating film to reach the semiconductor layer positioned underneath, the dosage is set to between $1\times10^{13}$ and $5\times10^{14}$ atoms/cm$^3$ and the acceleration voltage is set to between 80 and 160 keV. Periodic table group 15 elements, typically, phosphorus (P) and arsenic (As) are used as impurity elements that impart n-type conductivity to a semiconductor. Phosphorus (P) is used here in this step. The concentration of phosphorus of the semiconductor layer is in the concentration range of between $1\times10^{16}$ and $1\times10^{19}$ atoms/cm$^3$ by such ion doping. In this way, first impurity regions 124 to 129 are thus formed in the island semiconductor layer as shown in FIG. 2B.

In this step, at least the concentration gradient of phosphorus contained in the portion in the first impurity regions 124 to 128 that overlaps the gate electrodes 118 to 122 reflects the change in film thickness of the taper portions of the gate electrodes 118 to 122. In other words, the concentration of phosphorus that is doped into the first impurity regions 124 to 128 gradually becomes higher towards the edge portion of the gate electrode in the region overlapping the gate electrode. This is because the concentration of phosphorus that has reached the semiconductor layer changes due to the difference in the film thickness of the taper portion. Note that FIG. 2B shows an edge portion of the first impurity regions 124 to 128 with an oblique line. However, this diagram is not exactly a view showing the regions doped with phosphorus, but rather a view showing the above change in concentration of phosphorus occurring in accordance with the shape of the taper portions of the gate electrodes 118 to 122.

The formation of second impurity regions for functioning as a source region or a drain region in the n-channel TFT is performed next (n⁺ doping process). Resist masks 112 to 117 are left as they are, and new resist masks 155 to 157 are formed on resist masks 113, 115 and 116 by using the third photo-mask (PM3). They are formed so as to cover gate electrodes 119, 121 and 122 and a part of semiconductor layers 105, 107 and 108. Doping is performed by ion doping under a condition of low acceleration voltage of 10 to 30 keV. The second impurity regions 131 to 136 are thus formed. Since the gate insulating film 130 in these regions has been treated with over-etching in the step forming the gate electrodes, the film thickness of the gate insulating film has become thinner to between 70 and 100 nm compared with the initial thickness of 120 nm. Accordingly, phosphorus can be doped appropriately even under such a condition as low acceleration voltage. The concentration of phosphorus in these regions is set so that it is in the concentration range of between $1\times10^{20}$ and $1\times10^{21}$ atoms/cm$^3$ (See FIG. 2C).

Fourth impurity regions 140 and 141 are formed next as a source region and a drain region in island semiconductor layers 104 and 106, which form the p-channel TFTs. Here, an impurity element that imparts p-type is doped with the gate electrodes 118 and 120 as masks, and the fourth impurity region is formed in a self-aligning manner. At this point, the entire surface of island-like semiconductor layers 105, 107, and 108 that form the n-channel TFT is covered by resist masks 137 to 139, which are formed by using a fourth photomask (PM4). The impurity regions 140 and 141 to be formed here are then formed by ion doping using diborane ($B_2H_6$). Then the boron (B) concentration of the fourth impurity regions 140a and 141a that do not overlap with the gate electrode is made to be from $3\times10^{20}$ to $3\times10^{21}$ atoms/$cm^3$. In addition, because an impurity element is doped through the gate insulating film and the taper portion of the gate electrode into the impurity regions 140b and 141b that overlap the gate electrode, these regions are substantially formed as a third impurity region with the concentration set to at least $1.5\times10^{19}$ atoms/$cm^3$ or more. Since phosphorus (P) has already been doped into the fourth impurity regions 140a and 141a, and into the third impurity regions 140b and 141b in the previous step, the contained concentration of the fourth impurity regions 140a and 141a is from $1\times10^{20}$ to $1\times10^{21}$ atoms/$cm^3$ and the contained concentration of the third impurity regions 140b and 141b is from $1\times10^{16}$ to $1\times10^{19}$ atoms/$cm^3$. The boron (B) concentration to be doped in this step is set to be 1.5 to 3 times that of phosphorus (P). Accordingly, no obstacles of any kind will occur for the p-type impurity regions to function as the source region and the drain region of the p-channel TFT.

Thereafter, a first interlayer insulating film 142 is formed on the gate electrode and the gate insulating film as shown in FIG. 3A. It is appropriate to form the first interlayer insulating film from the silicon oxide film, the silicon oxynitride film, the silicon nitride film, or a laminate film of a combination of these films. Whichever it is, the first interlayer insulating film 142 is formed from an inorganic insulating material. The film thickness of the first interlayer insulating film 142 is between 100 and 200 nm. For the case of using the silicon oxide film here, the silicon oxide film can be formed by plasma CVD in which TEOS and $O_2$ are mixed, the reaction pressure is set to 40 Pa, and the substrate temperature is set between 300° C. and 400° C., and electric discharge is conducted at a high frequency (13.56 MHz) power density of 0.5 to 0.8 W/$cm^2$. Also, when using the silicon oxynitride film, it may be formed from a silicon oxynitride film that is manufactured from $SiH_4$, $N_2O$, and $NH_3$, or from $SiH_4$ and $N_2O$ by plasma CVD. In this case, the manufacturing conditions are as follows: the reaction pressure is set to between 20 and 200 Pa, and the substrate temperature is set between 300° C. and 400° C., and a high frequency (60 MHz) power density of 0.1 to 1.0 W/$cm^2$. Further, a hydrogenated silicon oxynitride film that is manufactured from $SiH_4$, $N_2O$, and $H_2$ is also applicable. Similarly, the silicon nitride film may also be manufactured from $SiH_4$ and $NH_3$ by plasma CVD.

Next, a step of activating the impurity elements which impart n-type or p-type and have been added at the respective concentrations is performed. In this step, thermal annealing is performed by using an annealing furnace. In addition, laser annealing or rapid thermal annealing (RTA) can also be employed. The thermal annealing is performed at 400° C. to 700° C., typically 500° C. to 600° C. in a nitrogen atmosphere which has an oxygen concentration of 1 ppm or less, preferably 0.1 ppm or less. Heat treatment is performed for 4 hours at 550° C. in this embodiment. Further, it is desirable to employ the laser annealing method if a plastic substrate, which has a low heat resistance temperature, is used as the substrate 101. (See FIG. 3B)

Following the activation process, the gas in the atmosphere is changed to perform heat treatment at 300° C. to 450° C. for between 1 and 12 hours in an atmosphere containing between 3 and 100% hydrogen and a step of hydrogenating the island semiconductor layers is performed. This step is for terminating the $10^{16}$ to $10^{18}$/$cm^3$ of dangling bonds in the island semiconductor layers by thermally excited hydrogen. In addition, plasma hydrogenation (using hydrogen excited by a plasma) may be performed as another means of hydrogenation. Whichever is used, it is desirable to reduce the defect density in the island semiconductor layers 104 to 108 to $10^{16}$/$cm^3$ or less. In order to do this, about 0.01 to 0.1 atomic % of hydrogen may be provided.

After the completion of the activation and the hydrogenation processes, a second interlayer insulating film 143 having an average thickness of between 1.0 to 2.0 µm is formed next from an organic insulating material. Materials such as polyimide, acrylic, polyamide, polyimide amide, and BCB (benzocyclobutene) can be used as the organic resin materials. For example, when using a thermal polymerization type polyimide, this is burnt at 300° C. using a clean oven after its application to the substrate. For the case of using acrylic, two-pack type is used and a main material and a hardening agent thereof are mixed together. Then after its application to the entire surface of the substrate by using a spinner, preheating is performed at 80° C. for 60 seconds by using a hot plate. The second interlayer insulating film is then formed by further burning it at 250° C. for 60 minutes using the clean oven.

By forming the second interlayer insulating film with an organic insulating material in this way, a good flat surface can be formed. In addition, organic resin materials are generally low in dielectric, and therefore parasitic capacitance can be reduced. However, because the second interlayer insulating film has absorbency, it is not suitable as a protecting film. Therefore, as in this embodiment, the silicon oxide film, the silicon nitride oxide film, the silicon nitride film, or a combination of these films that form the first interlayer insulating film 142 may be combined with the organic insulating film for the second interlayer insulating film.

A predetermined patterned resist mask is formed next by using a fifth photomask (PM5), and contact holes that reach the source regions and the drain regions formed in the respective island semiconductor layer are formed. These contact holes are formed by means of dry etching. In this case, first the second interlayer insulating film 143 made of an organic resin material is etched using a mixed gas of $CF_4$, $O_2$, and He as etching gas, and then the first interlayer insulating film 142 is etched with $CF_4$ and $O_2$ as etching gas. Furthermore, in order to raise the selective ratio with the island semiconductor layer, the etching gas is switched to $CHF_3$ to etch the gate insulating film 130 whereby a contact hole can be nicely formed.

A conductive metallic film is formed next by sputtering or vacuum evaporation. Then a resist mask pattern is formed by using a sixth photomask (PM6) and then etched to thereby form source wirings 144 to 148 and drain wirings 149 to 153. The drain wiring 153 here is for functioning as the pixel electrode. A drain wiring 154 indicates the pixel electrode belonging to a neighboring pixel. Although not shown in the figures, in this embodiment, these wirings are formed such that a Ti film is formed at a thickness of between 50 and 100 nm, a contact is formed with a semiconductor film that forms the source or the drain region of the island semiconductor layer, and an aluminum (Al) film is formed at a thickness of between 300 and 400 nm superposing the Ti film (indicated by the reference numerals 144*a* to 154*a* in FIG. 3C). A transparent conductive film is further formed on top of the aluminum film at a thickness of between 80 and 120 nm (indicated by the reference numerals 144*b* to 154*b* in FIG. 3C). An indium oxide/zinc oxide alloy (In$_2$O$_3$—ZnO) and a zinc oxide (ZnO) are also suitable materials for the transparent conductive film. In order to further improve the transmissivity of visible light and conductivity, zinc oxide added with gallium (Ga) (ZnO:G), etc. may be used preferably.

Accordingly, by using six photomasks, a substrate having the TFT of the driver circuit and the pixel TFT of the pixel portion formed on the same single substrate can thus be completed. In the driver circuit there are formed: a first p-channel TFT (A) 200*a*; a first n-channel TFT (A) 201*a*; a second p-channel TFT (A) 202*a*; and a second n-channel TFT (A) 203*a*. In the pixel portion there are formed: a pixel TFT 204; and a storage capacitor 205. For the sake of convenience, this type of substrate is referred to as an active matrix substrate in the present specification.

The first p-channel TFT (A) 200*a* of the driver circuit is a structure comprising a channel forming region 206, an LDD region 207 overlapping the gate electrode, a source region 208 and a drain region 209 formed from the fourth impurity region in the island semiconductor layer 104. The first n-channel TFT (A) 201*a* comprises a channel forming region 210, an LDD region 211 formed from the first impurity region and overlapping the gate electrode 119, and an LDD region 261 that does not overlap the gate electrode 119, a source region 212 and a drain region 213 that are formed from the second impurity region in the island semiconductor layer 105. Referring to the LDD region that overlaps the gate electrode 119 as an Lov region, the length of the Lov region in the channel length direction is set between 0.1 and 1.5 μm, preferably from 0.3 to 0.8 μm, for a channel length of 3 to 7 μm. Also, the LDD region that does not overlap the gate electrode 119 is referred to as Lff, and the length of the Loff in the channel length direction is 0.5 to 3.0 μm, preferably 1.0 to 2.0 μm. This Lov length will be controlled from the thickness of the gate electrode 119 and the angle of the taper portion θ1 and the length of LFF is determined by the measurements of the resist mask.

Figure 3C:
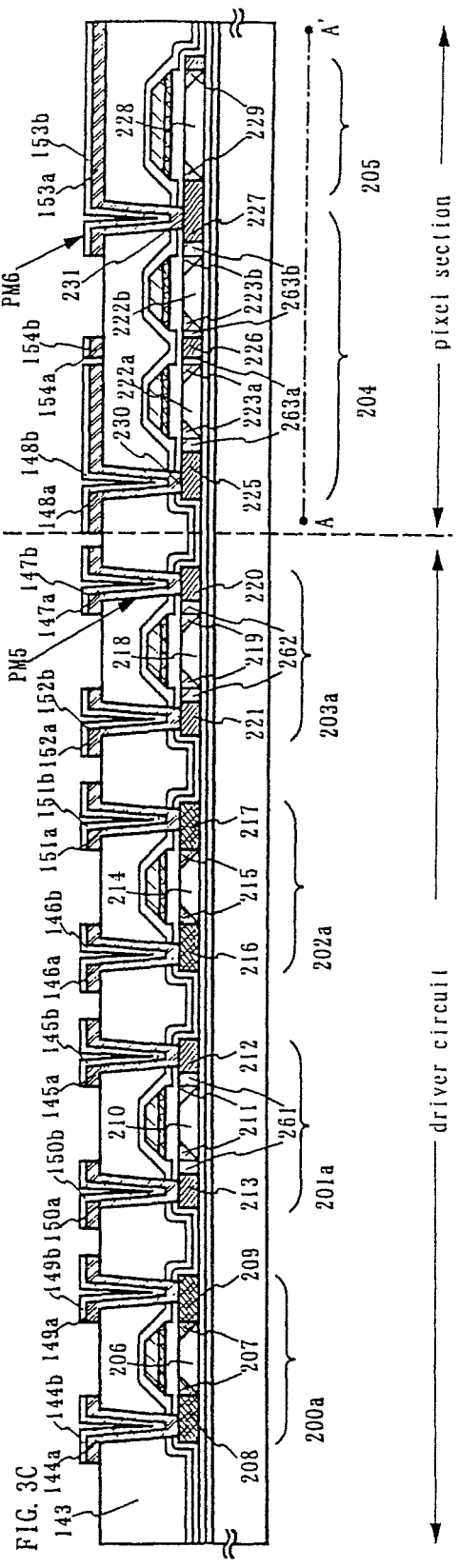
Figure 4:
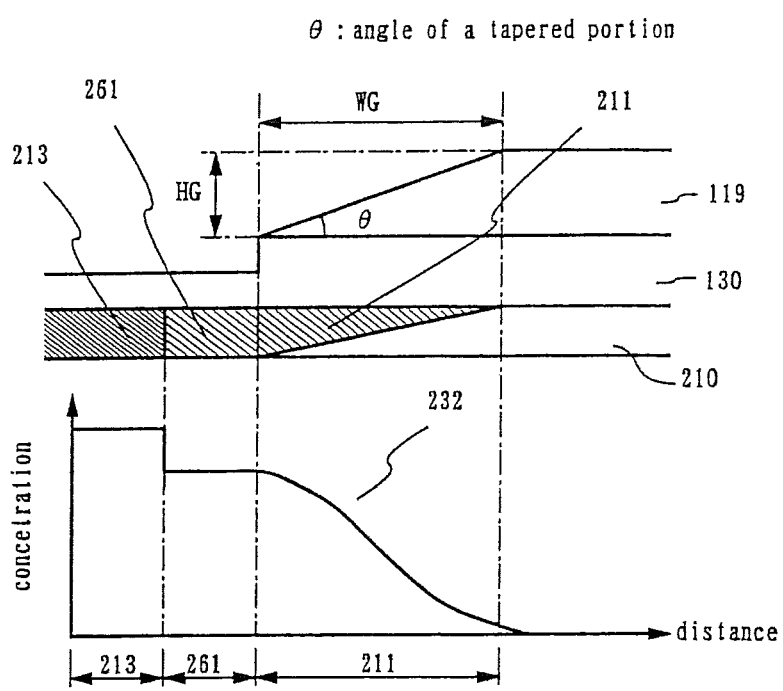
FIG. 4 is a diagram for explaining a structure of the LDD region of an n-channel TFT.

This LDD region will be explained using FIG. 4. Shown in FIG. 4 is a partial enlarged view of the first n-channel TFT (A) 201*a* of FIG. 3C. The LDD region (Lov) 211 is formed under a taper portion of the gate electrode. LDD region (Loff) 261 is formed so as not to overlap the gate electrode. At this point, the concentration distribution of phosphorus (P) in the LDD region (Lov) increases as it moves further away from the channel forming region 211 as indicated by a curve line 232. This proportion of increase differs depending on conditions such as the acceleration voltage and the dosage of ion doping, the angle θ1 of the taper portion of the gate electrode and the thickness of the gate electrode 119. With the edge portion of the gate electrode formed into a taper shape, an impurity element can be doped through the taper portion. Accordingly, an impurity region in which the concentration of the impurity element gradually changes can be formed within the semiconductor layer existing beneath the taper portion. On the other hand, the concentration in the LDD region (Loff) 261 can be made constant within the region. The present invention actively utilizes such impurity region. By forming this type of LDD region (Lov) in the n-channel TFT, the high electric field that generates in the vicinity of the drain region can be relaxed, and hence the generation of a hot carrier and deterioration of the TFT can be prevented. Further, LDD region (Loff) acts effectively on reduction of off current value. By disposing LDD regions that have such different functions in the same TFT, its electric characteristics can be enhanced.

Similarly, the second p-channel TFT (A) 202*a* of the driver circuit is a structure comprising a channel forming region 214, an LDD region 215 overlapping the gate electrode 120, a source region 216 and a drain region 217 that are formed from the fourth impurity region in the island semiconductor layer 106. The second n-channel TFT (A) 203*a* comprises a channel forming region 218, an LDD region (Lov) 219 overlapping the gate electrode 121, an LDD region (Loff) that does not overlap the gate electrode 121, a source region 220 and a drain region 221 that are formed from the second impurity region in the island semiconductor layer 107. The structure of the LDD region (Lov) 219 is the same as the LDD region (Lov) 211, and that of the LDD region (Loff) 262 is the same as the LDD region (Loff) 261.

The island-like semiconductor layer 108 of the pixel TFT 204 comprises channel forming regions 222*a* and 222*b*, LDD regions (Lov) 223*a* and 223*b* formed from the first impurity region and that overlap the gate electrode, LDD regions (Loff) 263*a* and 263*b* that do not overlap the gate electrode 122 and source or drain regions 225 to 227 formed from the second impurity region. The structures of the LDD regions (Lov) 223*a* and 223*b* are the same as that of the LDD region (Lov) 211 and the structures of the LDD regions (Loff) 263*a* and 263*b* are the same as that of the LDD region (Loff) 261. In addition, the storage capacitor 205 is formed from the capacitor wiring 123, the gate insulating film, and semiconductor layers 228 and 229 which are connected to the drain region 227 of the pixel TFT 204. In FIG. 3C, the n-channel TFT and the p-channel TFT of the driver circuit is a single gate structure in which one gate electrode is provided between a pair of source/drain region and the pixel TFT is a double gate structure. However, these TFTs may take either a single gate structure or a multi-gate structure in which a plural number of gate electrodes are provided between a pair of source/drain region without causing any problem.

Figure 10:
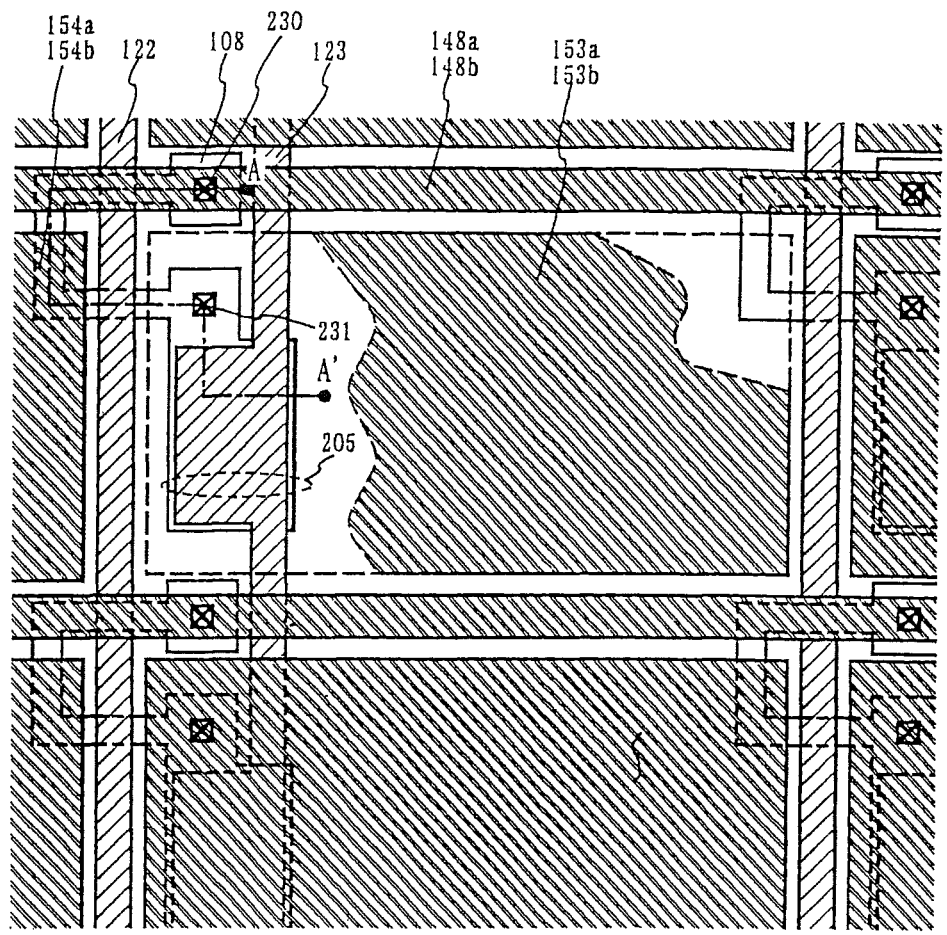
FIG. 10 is a top view showing a pixel of the pixel portion.

FIG. 10 is a top view showing nearly one full pixel of the pixel portion. The cross-sectional view taken along the line A-A' shown in FIG. 10 corresponds to the cross-sectional view of the pixel portion shown in FIG. 3C. In the pixel TFT 204, the gate electrode 122 intersects, through a gate insulating film not shown in the figure, with the semiconductor layer 108 underneath, and furthermore, extends over a plural number of island semiconductor layers to serve also as the gate wiring. The source region, the drain region, and the LDD region explained in FIG. 3C, are formed in the island semiconductor layer, although not shown in the figure. Further, reference numeral 230 denotes a contact area of the source wiring 148 and the source region 225, and reference numeral 231 denotes a contact area of the drain wiring 153 and the drain region 227. The storage capacitor 205 is formed of the region in which the semiconductor layers 228 and 229 extending from the drain region 227 of the pixel TFT 204 overlaps the capacitor wiring 123 through the gate insulating film. In this structure, an impurity element for valency control is not doped into the semiconductor layer 228.

The above structure as such has made it possible to improve the operating performances and the reliability of a semiconductor device by optimizing the structure of TFTs that compose various circuits of the semiconductor device in response to the specifications required by the pixel TFT and the driver circuits. Further, the activation of the LDD regions, the source regions, and the drain regions are easily performed by forming the gate electrode from a conductive material having heat resistivity.

In addition, during the formation of the LDD region that overlaps the gate electrode through the gate insulating film, the LDD region is formed to have a concentration gradient of the impurity element doped for the purpose of controlling the conductivity type. Accordingly, such a region having a concentration gradient is expected to further enhance the effect of alleviating the electric field, particularly in the vicinity of the drain region. Further, reduction of off current value is available by disposing LDD regions that do not overlap the gate electrodes.

Figure 8A:
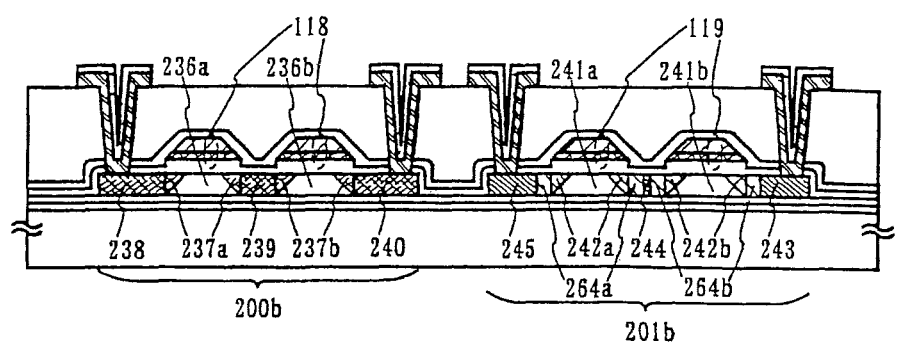
FIGS. 8A and 8B are sectional views showing a structure of a TFT of a driver circuit.

In the case of an active matrix liquid crystal display device, the first p-channel TFT (A) 200a and the first n-channel TFT (A) 201a are used for forming driver circuits such as a shift register circuit, a buffer circuit, and a level shifter circuit, which places importance on high speed operation. These circuits are shown as a logic circuit section in FIG. 3C. The structure of the LDD region 211 of the first n-channel TFT (A) 201a places importance in taking measures against hot carriers. Further, for the purpose of increasing resistance against voltage to stabilize operations, a TFT of the logic circuit section may be formed of a first p-channel TFT (B) 200b and a first n-channel TFT (B) 201b as shown in FIG. 8A. This TFT is a double gate structure in which two gate electrodes are formed between a pair of source/drain region. Similarly, this type of TFT can be manufactured by employing the processes of this embodiment. The first p-channel TFT (B) 200b is a structure comprising channel forming regions 236a and 236b, LDD regions 237a and 237b made from the third impurity region and overlapping the gate electrode 118, and a source region 238 and drain regions 239 and 240 made from the fourth impurity region in the island semiconductor layer. The first n-channel TFT (B) 201b comprises channel forming regions 241a and 241b, LDD regions (Lov) 242a and 242b formed from the first impurity region and overlapping the gate electrode 119, LDD regions (Loff) 264a and 264b that do not overlap the gate electrode 119, and a source region 243 and drain regions 244 and 245 that are formed from the second impurity region in the island semiconductor layer. The channel lengths are each set to 3 to 7 μm while the length in the channel length direction of the Lov region is set between 0.1 and 1.5 μm, preferably from 0.3 to 0.8 μm, and the length of the Loff is 0.5 to 3.0 μm, preferably from 0.3 to 0.8 μm. The voltage resistance can be enhanced by employing the structure of FIG. 8A.

Figure 8B:
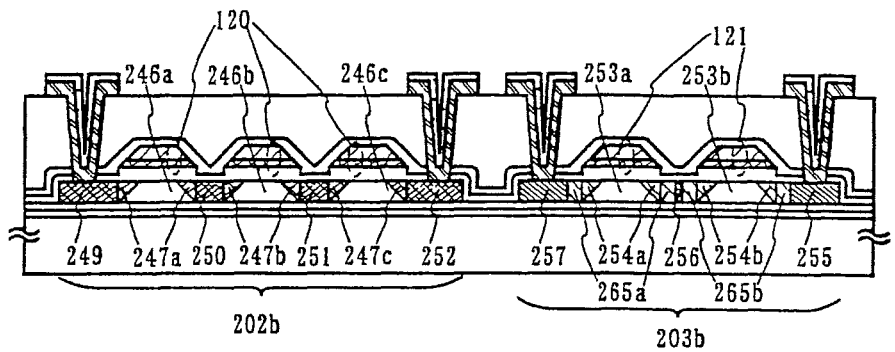

Further, the second p-channel TFT (A) 202a and the second n-channel TFT (A) 203a which have similar structure may be applied to the sampling circuit comprises of an analog switch. The sampling circuit places importance in taking measures against hot carriers and low off current operations. Accordingly, as shown in FIG. 8B, the TFT of this circuit may be formed from a second p-channel TFT (B) 202b and a second n-channel TFT (B) 203b. This second p-channel TFT (B) 202b is a triple gate structure in which three gate electrodes are formed between a pair of source/drain region. This type of TFT can be similarly manufactured by employing the processes of this embodiment. The second p-channel TFT (B) 202b is a structure comprising channel forming regions 246a, 246b, and 246c, LDD regions 247a, 247b, and 247c made from the third impurity region and overlapping the gate electrode 120, and a source region 249 and drain regions 250 to 252 made from the fourth impurity region in island semiconductor layers. The second n-channel TFT (B) 203b has channel forming regions 253a and 253b, LDD regions (Lov) 254a and 254b formed from the first impurity region and overlapping the gate electrode 121, and a source region 255 and drain regions 256 and 257 that are formed from the second impurity region in island semiconductor layers. Reduction of off current value can be achieved by adopting the structure shown in FIG. 8B.

An operator may appropriately select to make either the structure of the gate electrode of the TFT into a single structure or a multi-gate structure in which a plural number of gate electrodes are provided between a pair of source/drain region, in response to the characteristics of the circuits. In addition, a reflection type liquid crystal display device can be manufactured by using the active matrix substrate completed in this embodiment.

Embodiment 2

Examples of using heat-resistant conductive materials such as W and Ta as materials for the gate electrode were shown in Embodiment 1. The reason for using these type of materials resides in that it is necessary to activate the impurity element that was doped into the semiconductor layer for the purpose of controlling the conductive type after the formation of the gate electrode by thermal annealing at between 400° C. and 700° C. By implementing this step, it is necessary that the gate electrode have heat-resistivity. However, this type of heat-resistant conductive material has a sheet resistivity of about 10Ω, and hence is not always suitable for a liquid crystal display device having a screen size of a 4-inch class or more. This is because if a gate wiring to be connected to the gate electrode is formed of the same material, then the length of the lead wiring on the substrate inevitably becomes large. Thus, the problem of a wiring delay caused by the influence of wiring resistance cannot be ignored.

For example, 480 gate wirings and 640 source wirings are formed when the pixel density is VGA, and 768 gate wirings and 1024 source wirings are formed in the case of XGA. The screen size of the display region becomes 340 mm for a 13-inch class in diagonal length, and becomes 460 mm for an 18-inch class. In this embodiment, as a means of realizing this kind of liquid crystal display device, a method of forming the gate wiring from low-resistant conductive material such as Al and copper (Cu) will be explained using FIGS. 5A to 5C.

First, similar to Embodiment 1, the steps shown in FIGS. 1A to 2D will be performed. Then a step of activating the impurity element doped into the respective island semiconductor layers for the purpose of controlling the conductive type is performed. This step is performed by thermal annealing using an annealing furnace. In addition, laser annealing or rapid thermal annealing (RTA) can also be employed. The thermal annealing process is performed at 400° C. to 700° C., typically 500° C. to 600° C. in a nitrogen atmosphere which has an oxygen concentration of 1 ppm or less, preferably 0.1 ppm or less. In this embodiment, heat treatment is performed for 4 hours at 500° C.

Through this heat treatment, conductive layers (B) 118b to 123b forming the gate electrodes 118 to 122 and the capacitor wiring 123, come to have conductive layers (C) 118c to 123c formed to a thickness of 5 to 80 nm from the surfaces. For example, when the conductive layers (B) 118b to 123b are tungsten (W), tungsten nitride (WN) is formed, and tantalum nitride (TaN) is formed when the conductive layers are tantalum (Ta). Further, the conductive layers (C) 118c to 123c can be formed similarly by exposing the gate electrodes 118 to 123 to a plasma atmosphere containing nitrogen using nitrogen, ammonia, and the like. In addition, a step of hydrogenating the island semiconductor layers is performed by heat treatment at 300 to 450° C. for between 1 and 12 hours in an atmosphere containing between 3 and 100% hydrogen. This step is one for terminating dangling bonds in the semiconductor layers with thermally excited hydrogen. Plasma hydrogenation (using hydrogen excited by a plasma) may be performed as another means of hydrogenation. (See FIG. 5A)

After the activation and hydrogenation steps are completed, a gate wiring is formed from a low-resistant conductive material. The low-resistant conductive layer is formed of a conductive layer (D) made from a low-resistant conductive material which has aluminum (Al) or copper (Cu) as its principal constituent. For example, an aluminum film containing between 0.1 and 2% by weight of titanium (Ti) is formed as the conductive layer (D) on the entire surface (not shown). The conductive layer (D) may be foiled with a thickness of 200 to 400 nm (preferably 250 to 350 nm). Then using a photomask to form a predetermined resist pattern, the conductive layer is etched in order to form gate wirings 233 and 234, and a capacitor wiring 235. Then by removing the conductive layer (D) by wet etching using a phosphoric acid-based etching solution, the gate wiring can be formed while maintaining the selective workability with the base. A first interlayer insulating film 290 is formed in the same way as that of Embodiment 1. (See FIG. 5B.)

Figure 6A:
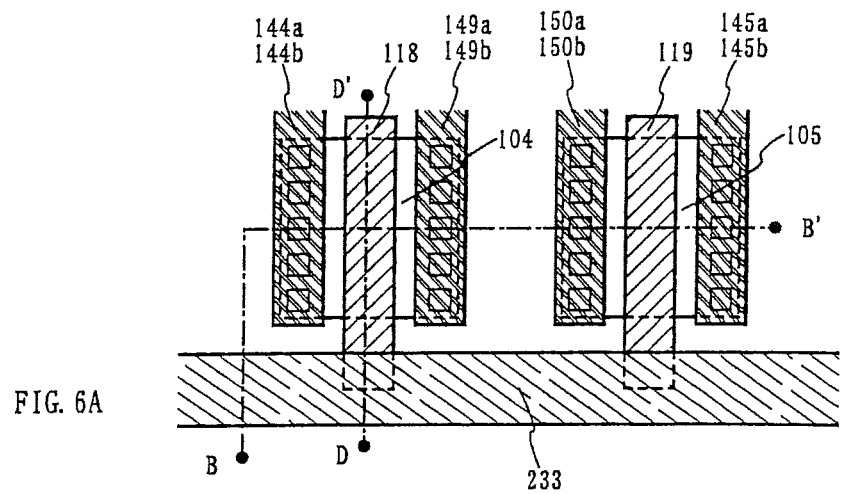
FIGS. 6A and 6B are top views showing structures of a TFT of a driver circuit and a pixel TFT.
Figure 6B:
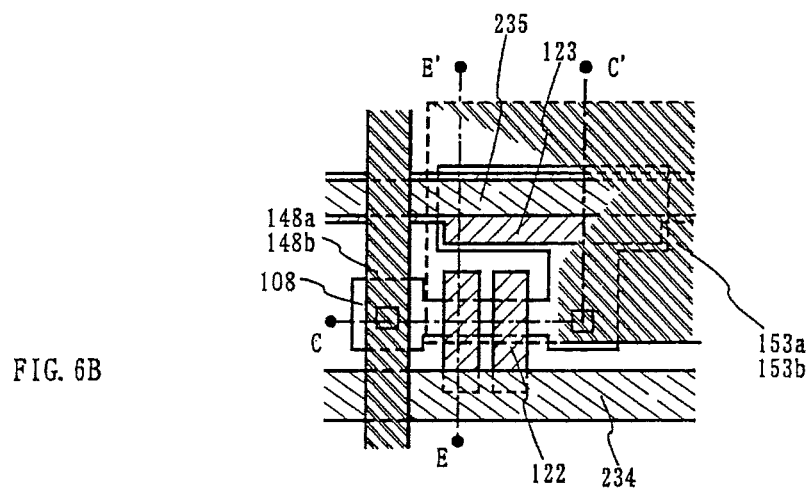
Figure 7A:
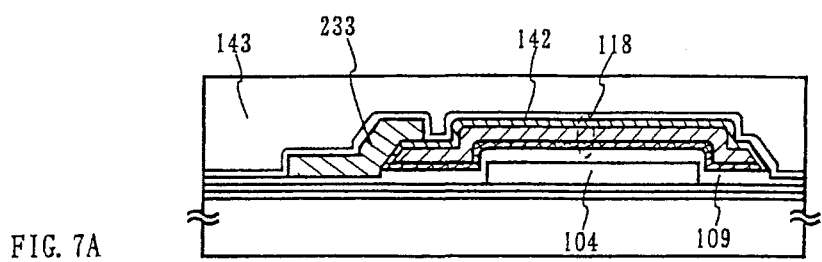
FIGS. 7A and 7B are sectional views showing steps of manufacturing a TFT of a driver circuit.
Figure 7B:
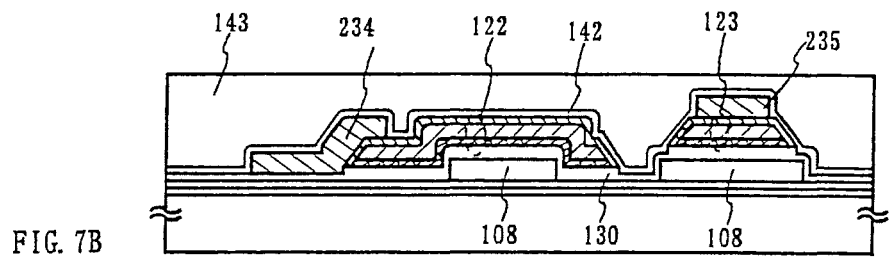

Thereafter, similar to Embodiment 1, by forming the second interlayer insulating film 147 made of an organic insulating material, source wirings 148 to 151 and 167, and drain wirings 153 to 156 and 168, the active matrix substrate can thus be completed. FIGS. 6A and 6B show top views of this state, and the cross sections taken along the line B-B' of FIG. 6A and the line C-C' of FIG. 6B correspond to the A-A' and C-C' cross sections, respectively, in FIG. 5C. Although the gate insulating film, the first interlayer insulating film, and the second interlayer insulating are omitted from the FIGS. 6A and 6B, the source and drain regions of the island semiconductor layers 104, 105, and 108 not shown in the figure are connected to the source wirings 144, 145 and 148, and drain wirings 149, 150 and 153 through contact holes. Further, the cross sections taken along the line D-D' of FIG. 6A and the line E-E' of FIG. 6B are shown in FIGS. 7A and 7B, respectively. The gate wiring 233 is formed overlapping the gate electrodes 118 and 119, and the gate wiring 234 is formed overlapping the gate electrode 122 in the outside of the island semiconductor layers 104, 105, and 108. Thus, the conductive layer (C) and the conductive layer (D) are in close contact to be electrically communicated. By forming the gate wiring from a low-resistant conductive material in this way, the wiring resistance can be sufficiently reduced. Accordingly, the present invention can be can be applied to a display device that has pixel portion (screen size) of 4-inch class or more.

Embodiment 3

The active matrix substrate manufactured in Embodiment 1 is applicable for a reflection type liquid crystal display device as is. On the other hand, in the case of applying it to a transmission type liquid crystal display device, then it is appropriate to form the pixel electrodes provided in each pixel of the pixel portion with transparent electrodes. A method of manufacturing an active matrix substrate corresponding to the transmission type liquid crystal display device is explained in Embodiment 3 with references to FIGS. 9A to 9D.

Figure 9A:
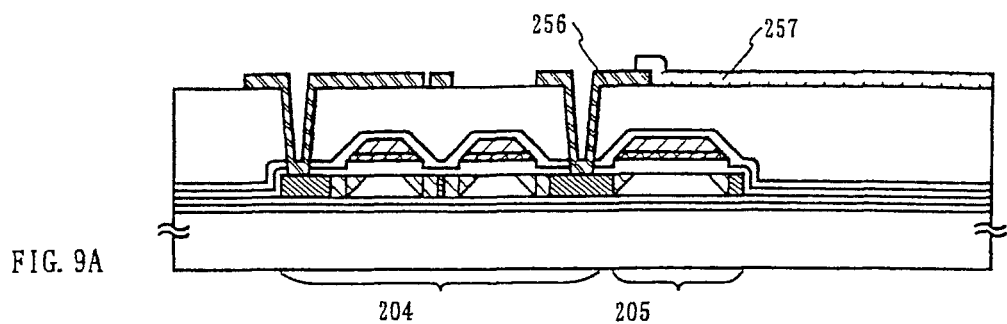
FIGS. 9A to 9D are sectional views showing a structure of a pixel TFT.
Figure 9B:
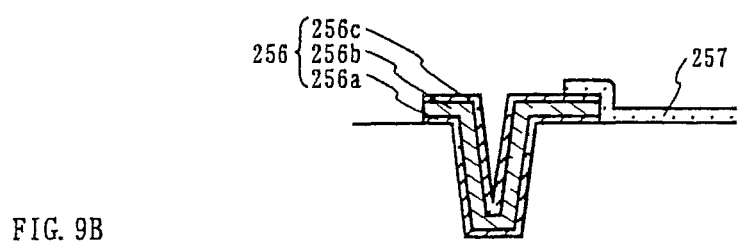

The active matrix substrate is manufactured in the same way as Embodiment 1. In FIG. 9A, a conductive metallic film is formed by sputtering or vacuum evaporation to form a source wiring and a drain wiring. This structure will be explained in detail with reference to FIG. 9B using the drain wiring 256 as an example. A Ti film 256a is formed at a thickness of between 50 and 150 nm, and then a contact is formed with a semiconductor film that forms the source or the drain region in an island semiconductor layer. Next an aluminum (Al) film 256b is formed at a thickness of between 300 and 400 nm overlapping on the Ti film 256a. Further, a Ti film 256c or a titanium nitride (TiN) film is formed at a thickness of between 100 and 200 nm to thereby form a three-layer structure. Then a transparent conductive film is formed on the entire surface. Pixel electrodes 257 are formed by a patterning process and an etching process, using a photomask. The pixel electrode 257 is formed on a second interlayer insulating film made of an organic resin material and sets aside a portion for overlapping with the drain wiring 256 of the pixel TFT 204 in order to form an electrical connection.

Figure 9C:
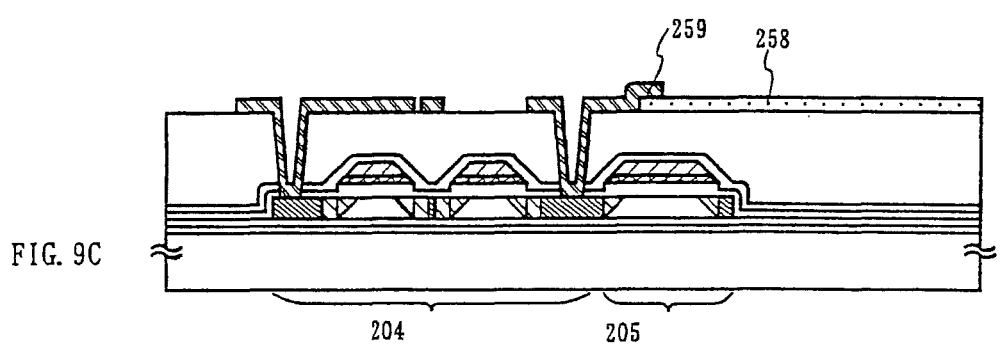
Figure 9D:
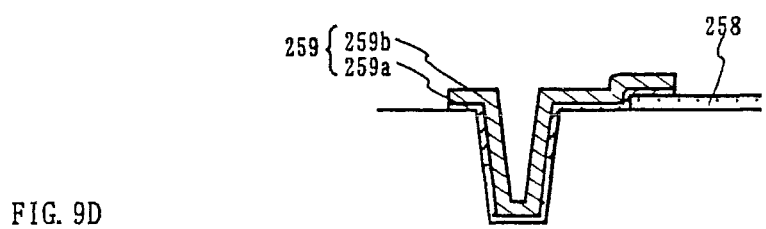

FIG. 9C is an example of first forming a transparent conductive film on the second interlayer insulating film 143, performing a patterning process and an etching process to form a pixel electrode 258, and then forming a drain wiring 259 by a portion that overlaps with the pixel electrode 258. As shown in FIG. 9D, the drain wiring 259 is provided by forming a Ti film 259a at a thickness of between 50 and 150 nm, forming a contact hole with a semiconductor film that forms the source or the drain region in an island semiconductor layer, and then forming an aluminum film 259b at a thickness of between 300 and 400 nm overlapping on the Ti film 259a. With this structure, the pixel electrode 258 is in contact only with the Ti film 259a that forms the drain wiring 259. Consequently, the transparent conductive film material and Al reacting from direct contact can definitely be prevented.

Materials such as indium oxide ($In_2O_3$), or an indium oxide/tin oxide alloy ($In_2O_3$—$SnO_2$:ITO) formed by sputtering or vacuum evaporation may be used as materials for the transparent conductive film. The etching treatment of this type of material is performed with hydrochloric acid solutions. However, in particular, the etching of ITO readily generates residues. Therefore, an indium oxide/zinc oxide alloy ($In_2O_3$—ZnO) may be used in order to improve the etching workability. The indium oxide/zinc oxide alloy has excellent flat and smooth surface properties, and also has excellent thermal stability in regards to ITO. Accordingly, in the structure of FIGS. 9A and 9B, at an edge surface of a drain wiring 256 where the Al film 256b comes into contact with the pixel electrode 257, corrosion reaction with Al can be prevented. Similarly, zinc oxide (ZnO) is also a suitable material. In order to further improve the transmissivity of visible light and conductivity, zinc oxide doped with gallium (Ga) (ZnO:G), etc. may be used.

In Embodiment 1, an active matrix substrate that can be used for manufacturing the reflection type liquid crystal display device was fabricated by using 6 photomasks. The addition of one more photomask (a total of 7 photomasks) can thus complete an active matrix substrate corresponding to the transmission type liquid crystal display device. Though the steps of described in this embodiment are similar to those in Embodiment 1, this kind of structure can be applied to the active matrix substrate shown in Embodiment 2.

Embodiment 4

Another method of manufacturing a crystalline semiconductor layer that forms an active layer of a TFT of the active matrix substrate indicated in Embodiment 1 to Embodiment 3 is shown here in Embodiment 4. A crystalline semiconductor layer is formed by crystallizing an amorphous semiconductor layer by thermal annealing, laser annealing, or rapid thermal annealing (RTA) or the like. Another crystallization method disclosed in Japanese Patent Application Laid-open No. Hei 7-130652 in which a catalytic element is used can also be applied. An example of this case is explained with references to FIGS. 11A to 11C.

Figure 11A:
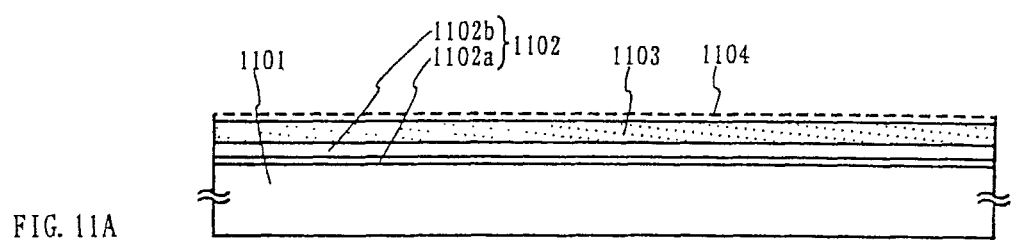
FIGS. 11A to 11C are sectional views showing steps of manufacturing a crystalline semiconductor layer.

As shown in FIG. 11A, base films 1102a and 1102b and a semiconductor layer 1103 having an amorphous structure formed at a thickness of between 25 to 80 nm are formed over a glass substrate 1101, similar to Embodiment 1. An amorphous silicon (a-Si) film, an amorphous silicon germanium (a-SiGe) film, an amorphous silicon carbide (a-SiC) film, an amorphous silicon tin (a-SiSn) film, etc. are applicable for the amorphous semiconductor layer. It is appropriate to form these amorphous semiconductor layers to contain hydrogen at about 0.1 to 40 atomic %. For example, a 55 nm thick amorphous silicon film is formed. An aqueous solution containing 10 ppm by weight conversion of a catalytic element is then applied by spin coating in which application is performed by rotating the substrate with a spinner, forming a layer 1104 containing the catalytic element. Catalytic elements include nickel (Ni), germanium (Ge), iron (Fe), palladium (Pd), tin (Sn), lead (Pb), cobalt (Co), platinum (Pt), copper (Cu), gold (Au), and the like. Other than spin coating, the catalytic element containing layer 1104 may also be made by forming a 1 to 5 nm thick layer of the above catalytic elements by printing, a spraying method, and the bar coater method, or sputtering or vacuum evaporation.

Figure 11B:
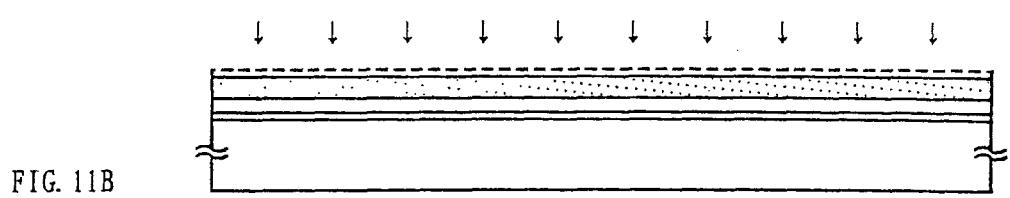
Figure 11C:
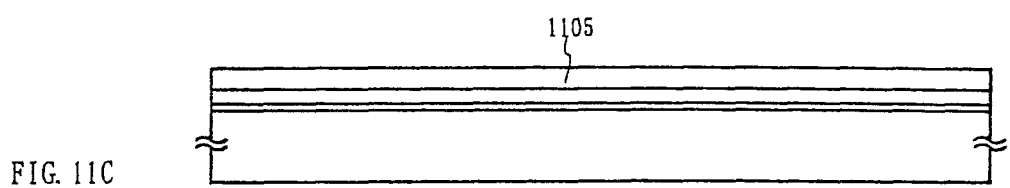

In the crystallization step shown in FIG. 11B, heat treatment is first performed for approximately 1 hour at between 400° C. and 500° C., making the amount of hydrogen contained in the amorphous silicon film 5 atomic % or less. If the initial amount of hydrogen contained in the amorphous silicon film after film deposition is this value, then in this case, heat treatment need not be performed. Thermal annealing is then performed in a nitrogen atmosphere at 550° C. to 600° C. for between 1 and 8 hours using an annealing furnace. A crystalline semiconductor layer 1105 made from the crystalline silicon film can thus be obtained through the above steps (See FIG. 11C). However, if the crystalline semiconductor layer 1105, manufactured by this thermal annealing, is observed microscopically using an optical microscope, it is discerned that amorphous region remains locally. In this case, from observation of spectrum using a Raman spectroscopy, an amorphous constituent observed at 480 cm$^{-1}$ has a broad peak. Therefore, after thermal annealing, treating the crystalline semiconductor layer 1105 with the laser annealing method explained in Embodiment 1 is an effective means applicable for enhancing the crystallinity of the crystalline semiconductor film.

Figure 12A:
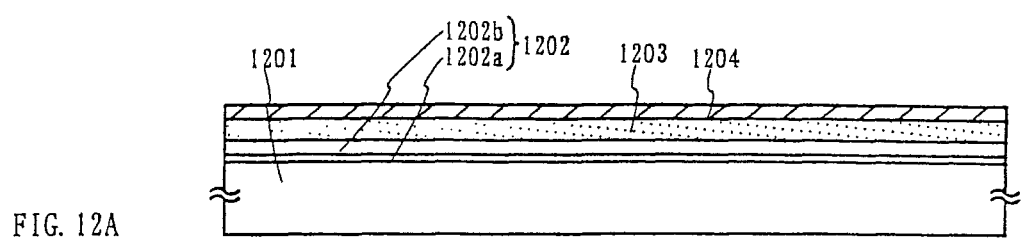
FIGS. 12A to 12C are sectional views showing steps of manufacturing a crystalline semiconductor layer.
Figure 12B:
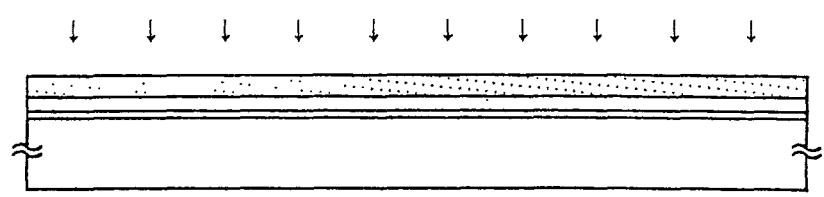
Figure 12C:
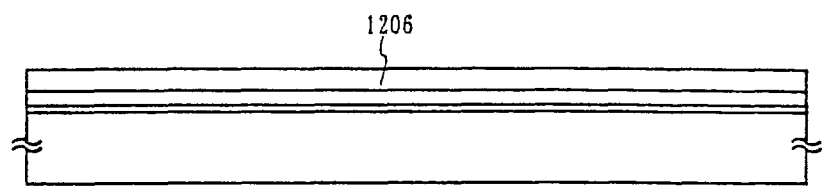

Similarly, FIGS. 12A to 12C also show an example of a crystallization method using a catalytic element in which a layer containing a catalytic element is formed by sputtering. First, base films 1202a and 1202b and a semiconductor layer 1203 having an amorphous structure formed at a thickness of between 25 to 80 nm are formed over a glass substrate 1201, similar to Embodiment 1. Then about a 0.5 to 5 nm thick oxide film is formed on the surface of the semiconductor layer 1203 having an amorphous structure (not shown in the Figure). As an oxide film having such thickness, an appropriate coating may be actively formed by plasma CVD or sputtering, but the oxide film may also be formed by exposing the surface of the semiconductor layer 1203 having an amorphous structure to an oxygen atmosphere in which the substrate has been heated at 100° C. to 300° C. and plasma treated, or exposing the surface of the semiconductor layer 1203 having an amorphous structure to a solution containing hydrogen peroxide ($H_2O_2$). The oxide film may also be formed by irradiating infrared light into an atmosphere containing oxygen to generate ozone and then exposing the semiconductor layer 1203 having an amorphous structure to the ozone atmosphere.

In this way, a layer 1204 containing the above catalytic element is formed by sputtering, on the semiconductor layer 1203 having an amorphous structure with a thin oxide film on its surface. No limitations are placed on the thickness of this layer, but it is appropriate to form this layer at about 10 to 100 nm. For example, an effective method is to form a Ni film with Ni as the target. In sputtering, a part of a high-energy particle made from the above catalytic element accelerated in the electric field also comes flying to the substrate side and is driven into the close vicinity of the surface of the semiconductor layer 1203 having an amorphous structure or into the oxide film which is formed on the surface of the semiconductor layer 1203. This proportion differs depending on conditions of generating plasma or the bias state of the substrate. However, it is appropriate to set the amount of catalytic element to be driven into the close vicinity of the surface of the semiconductor layer 1203 having an amorphous structure and within the oxide film to fall between $1\times10^{11}$ and $1\times10^{14}$ atoms/cm$^2$.

Then the layer 1204 containing a catalytic element is selectively removed. For example, if this layer is formed from the Ni film, it may be removed by a solution such as nitric acid, or if an aqueous solution containing fluoric acid is used, not only the Ni film but also the oxide film formed on the semiconductor layer 1203 having an amorphous structure can be removed at the same time. Whichever is used, the amount of catalytic element in the close vicinity of the surface of the semiconductor layer 1203 having an amorphous structure should be approximately between $1\times10^{11}$ and $1\times10^{14}$ atoms/cm$^2$. As shown in FIG. 12B, the crystallization step is performed by thermal annealing, similarly to FIG. 11B, and a crystalline semiconductor layer 1205 can thus be obtained (See FIG. 11C)

By forming the island semiconductor layers 104 to 108 from the crystalline semiconductor layers 1105 and 1205 manufactured in FIGS. 11A to 11C or FIGS. 12A to 12C, an active matrix substrate can be completed, similarly to Embodiment 1. However, in crystallization process, if a catalytic element for promoting the crystallization of silicon is used, a small amount (about $1\times10^{17}$ to $1\times10^{19}$ atoms/cm$^3$) of the catalytic element remains within the island semiconductor layers. It is, of course, possible to complete the TFT in such a state, but it is preferred to remove the remaining catalytic element from at least the channel forming region. One of the means of removing this catalytic element is a means using gettering action of phosphorous (P).

Figure 3B:
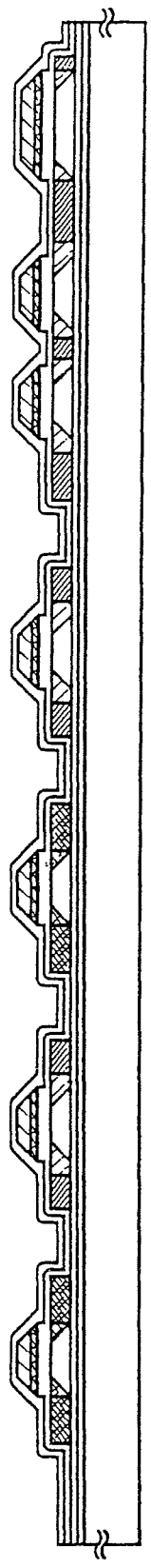
Figure 13:
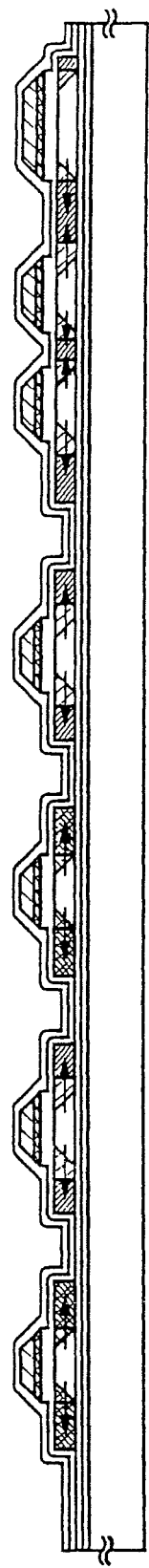
FIG. 13 is a sectional view showing a step of manufacturing a pixel TFT and a TFT of a driver circuit.

The gettering treatment with phosphorous used in this purpose may be performed together with the activation step explained in FIG. 3B. This state is explained with reference to FIG. 13. The concentration of phosphorous (P) necessary for gettering may be on a similar order as the impurity concentration of the second impurity regions, and the catalytic element can be segregated at this concentration from the channel forming regions of the n-channel TFT and the p-channel TFT, into the phosphorous (P) contained impurity regions, by the thermal annealing at the activation step. (direction of an arrow in FIG. 13) As a result, the catalytic element is segregated into the impurity regions at a concentration of about $1\times10^{17}$ to $1\times10^{19}$ atoms/cm$^3$. A TFT with good characteristics can be attained because the off current value of a TFT manufactured in this way is reduced, and high electric field mobility is attained due to good crystallinity.

Embodiment 5

Figure 14A:
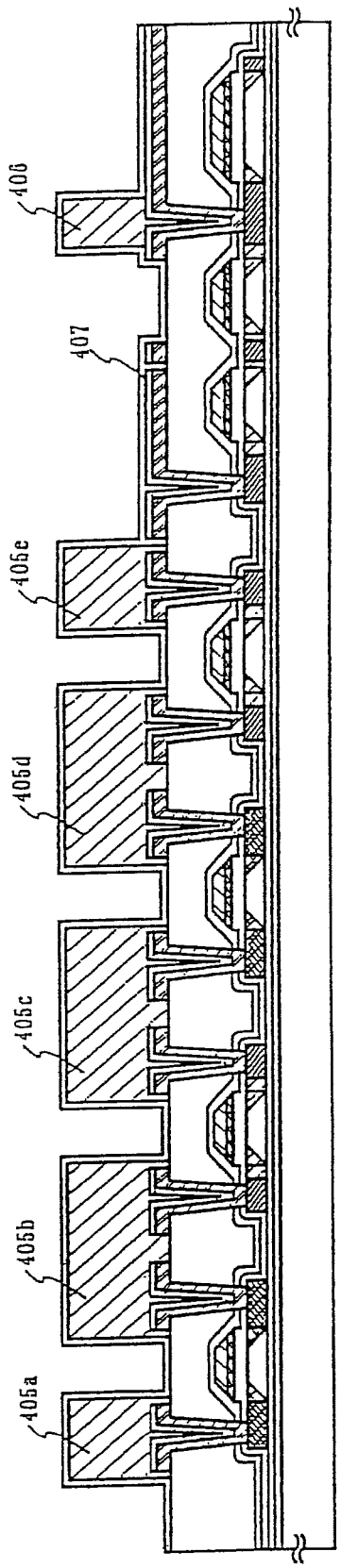
FIGS. 14A and 14B are sectional views showing steps of manufacturing an active matrix type liquid crystal display device.
Figure 15:
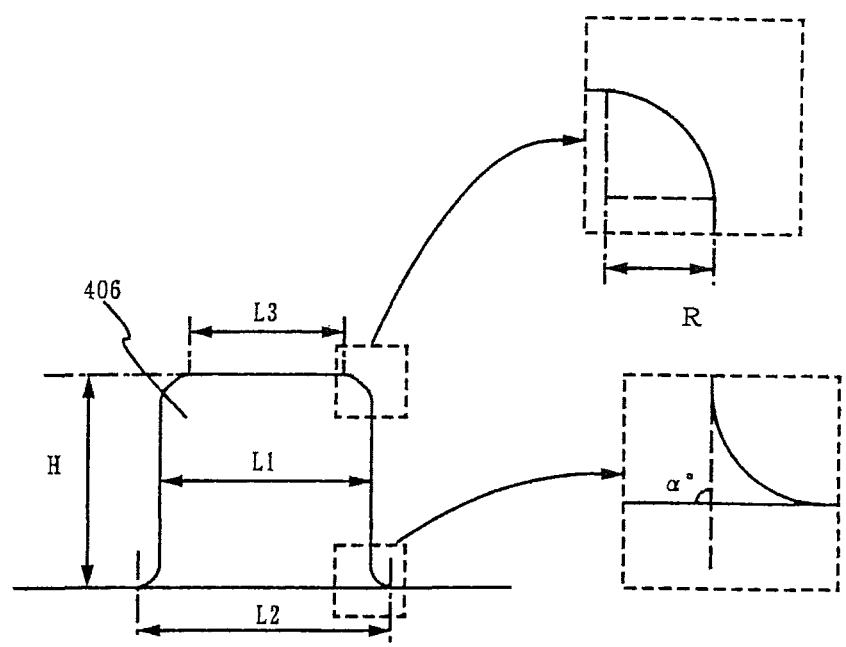
FIG. 15 is a diagram for explaining the shape of a column-shape spacer.

A method of manufacturing an active matrix liquid crystal display device from the active matrix substrate fabricated in Embodiment 1 will be explained here in this Embodiment. As shown in FIG. 14A, first a spacer made from a column-shape spacer is formed on the active matrix substrate in the state of FIG. 3C. The spacer may be provided by a method of spraying several μm of grains. A method of forming the spacer by patterning after forming a resin film on the entire surface of the substrate is adopted here in this embodiment. The material for such kind of spacer is not limited. For example, using the JSR product NN700, after application to the substrate by a spinner, a predetermined pattern is formed by exposure and development treatment. Furthermore, it is cured by being heated in a clean oven at 150° C. to 200° C. The shape of the spacer formed in this way may be made different depending on the conditions of the exposure and development treatment. As shown in FIG. 15, the spacer is formed so that its shape becomes a column-shape with a flat top, which is a preferred shape because when an opposing substrate is bonded to this substrate, its mechanical strength as a liquid crystal display panel can be ensured. The shape of the spacer such as a conical shape or a pyramid shape is not specially limited thereto. For example, when the spacer is a conical shape, its specific measurements are as follows: the height H is set between 1.2 and 5 μm, the average radius L1 is set between 5 and 7 μm, and the ratio of the average radius L1 and the radius of the bottom portion L2 is set to 1 to 1.5. The taper angle of the side surface at this point is ±15° or less.

Figure 14B:
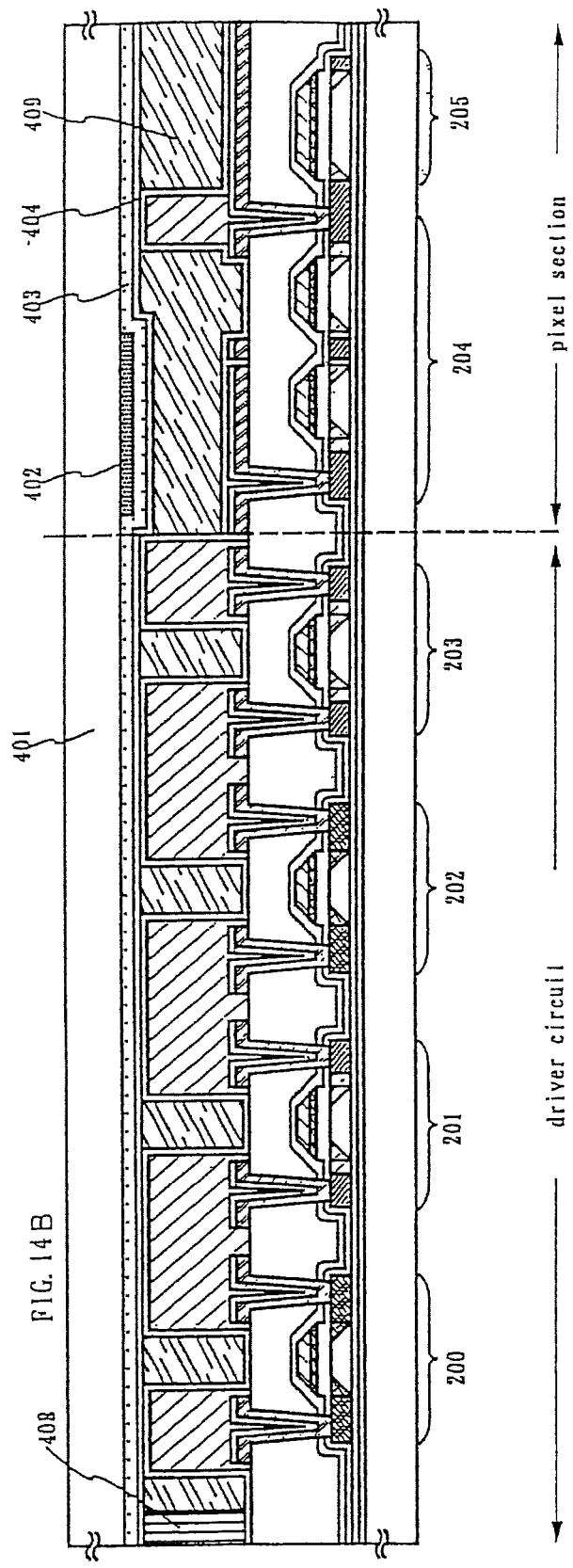

The arrangement of the column-shape spacers may be arbitrarily determined, but preferably it is appropriate to form a spacer 406 overlapping the contact area 231 of the drain wiring 153 (pixel electrode) in the pixel portion so as to cover that overlapped portion as shown in FIG. 14A. Liquid crystal cannot be smoothly oriented in a portion where the levelness of the contact area 231 has been ruined. Hence, the column-shape spacer 406 is formed as in the form of filling the contact area 231 with resin used for the spacer, whereby disclination or the like can be prevented. In addition, spacers 405a to 405e are formed on the TFT of the driver circuit. These spacers may be formed extending over the entire surface of the driver circuit portion, and may also be formed so as covering the source wiring and the drain wiring as shown in FIGS. 14A and 14B.

Thereafter, an alignment film 407 is formed. A polyimide resin is often used for the alignment film of a liquid crystal display device. After forming the alignment films, a rubbing process is performed so that the liquid crystal molecules are oriented with a certain fixed pre-tilt angle. The rubbing process is performed such so that an area of 2 μm or less from the edge portion of the column-shape spacer 406 provided in the pixel portion to the rubbing direction, is not rubbed. Further, since the generation of static electricity from the rubbing process is often a problem, an effect of protecting the TFT from the static electricity can be attained by forming the spacers 405a to 405e formed on the TFT of the driver circuit. Although not described in the figures, the substrate may have a structure in which the alignment film 407 is formed before forming the spacers 406 and 405a to 405e.

A light shielding film 402, a transparent conductive film 403, and an alignment film 404 are formed on an opposing substrate 401, which is opposed to the active matrix substrate. The light shielding film 402 is formed of films such as a Ti film, a Cr film, and an Al film at a thickness of between 150 and 300 μm. The active matrix substrate, on which the pixel portion and the driver circuit are formed, and the opposing substrate are then joined together by a sealing agent 408. A filler (not shown in the figures) is mixed into the sealing agent 408, and the two substrates are joined together with a uniform spacing by the filler and the spacers 406 and 405a to 405e. Next, a liquid crystal material 409 is injected between both substrates. A known liquid crystal material may be used as the liquid crystal material. For example, besides the TN liquid crystal, a thresholdness antiferroelectric mixed liquid crystal that indicates electro-optical response characteristics of continuously changing transmittance with respect to an electric field may also be used. Among such thresholdness antiferroelectric mixture liquid crystal, there is a type that indicates a V-shaped electro-optical response characteristic. In this way the active matrix type liquid crystal display device shown in FIG. 14B is completed.

Figure 16:
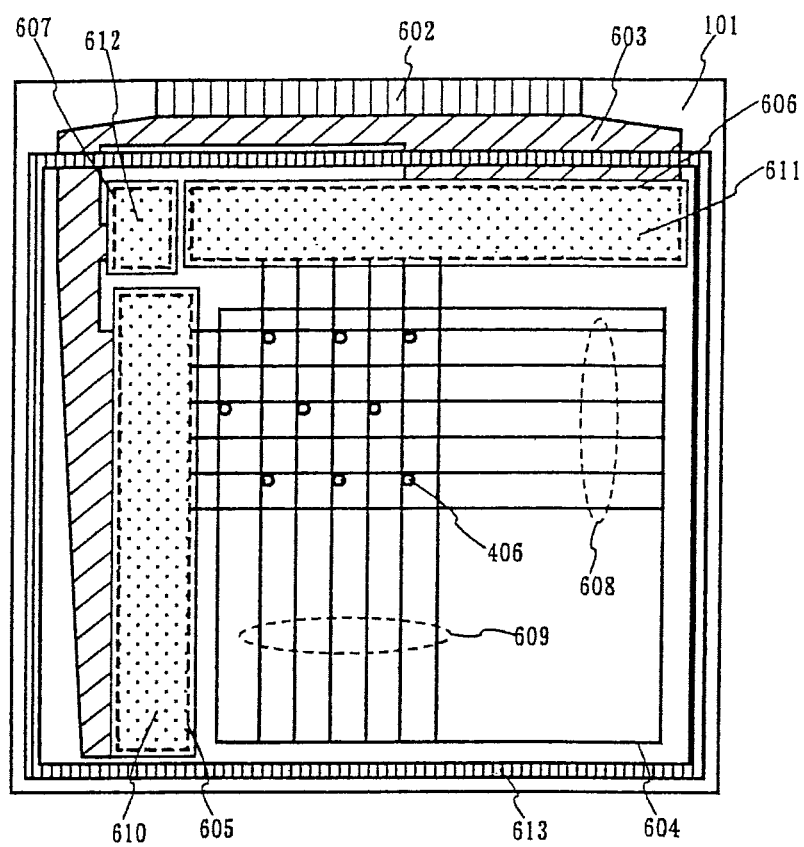
FIG. 16 is a top view for explaining the arrangement of an input/output terminal, a wiring, an arrangement of a circuit, a spacer, and a sealing agent of a liquid crystal display device.

FIG. 16 is a top view showing this type of active matrix substrate and the positional relation of the pixel portion and the driver circuit portion versus the spacers and the sealing agent. A scanning signal driver circuit 605 and an image signal driver circuit 606 as driver circuits are provided in the periphery of a pixel portion 604 on the glass substrate 101 described in Embodiment 1. In addition, a signal processing circuit 607 such as a CPU or a memory circuit may also be added. Then these driver circuits are connected to an external input/output terminal 602 by a connecting wiring 603. In the pixel portion 604, a set of gate wirings 608 extending from the scanning signal driver circuit 605 and a set of source wirings 609 extending from the image signal driver circuit 606 intersect in matrix to form pixels. Each pixel is provided with the pixel TFT 204 and the storage capacitor 205.

In FIG. 14A the column-shape spacer 406 provided in the pixel portion may be provided not only to each pixel, but also to every several pixels or several tens of the pixels arranged in a matrix manner as shown in FIG. 16. In other words, it is possible to set the ratio of the total number of pixels composing the pixel portion to the number of spacers between 20% and 100%. In addition, the spacers 405a to 405e provided in the driver circuits portion may be formed so as to cover the entire surface of the circuits, or may be provided in accordance with the position of the source wiring and the drain wiring of each TFT. In FIG. 16, reference numerals 610 to 612 denote the arrangement of the spacers provided in the driver circuits portion. In FIG. 16, the sealing agent 619 is formed on the exterior of the pixel portion 604, the scanning signal driver circuit 605, the image signal driver circuit 606, and the signal processing circuit 607 of the other circuits, and on the interior of an external input/output terminal 602, that are formed over the substrate 101.

Figure 17:
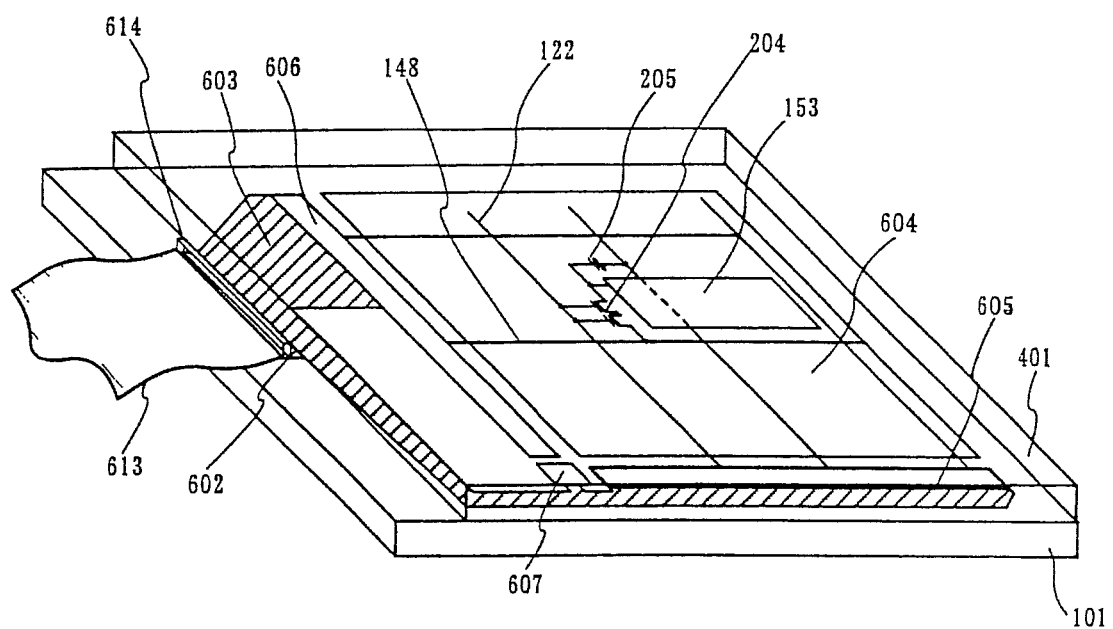
FIG. 17 is a perspective view showing the structure of a liquid crystal display device.

Next, the structure of this kind of active matrix liquid crystal display device is explained using the perspective view of FIG. 17. In FIG. 17, the active matrix substrate comprises the pixel portion 604, the scanning signal driver circuit 605, the image signal driver circuit 606, and the signal processing circuit 607 of the other circuits formed over the glass substrate 101. The pixel TFT 204 and the storage capacitor 205 are provided in the pixel portion 204, and the driver circuit formed in the periphery thereof is structured based on a CMOS circuit. The scanning signal driver circuit 605 and the image signal driver circuit 606 are connected to the pixel TFT 204 by the gate wiring 122 and the source wiring 148, respectively, extending to the pixel portion 604. Further, an FPC (flexible print circuit) 613 is connected to the external input/output terminal 602 to be utilized for inputting signals such as image signals. The FPC 613 is firmly adhered in this area by a strengthening resin 614. The connecting wiring 603 is connected to the respective driver circuits. Further, though not shown in the figure, a light shielding film and a transparent conductive film are provided on the opposing substrate 401.

A liquid display device with this kind of structure can be formed by using the active matrix substrate described in Embodiments 1 to 3. The reflection type liquid crystal display device can be attained with employment of the active matrix substrate shown in Embodiment 1 whereas the transmission type liquid crystal display device can be attained with employment of the active matrix substrate shown in Embodiment 3.

Embodiment 6

Figure 18:
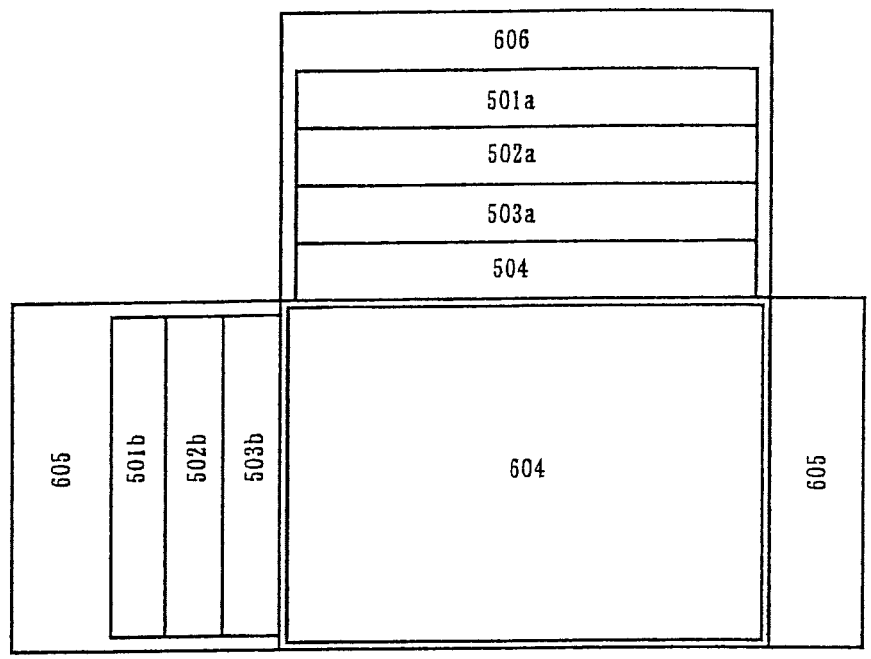
FIG. 18 is a block diagram for explaining a circuit structure of a liquid crystal display device.
Figure 19A:
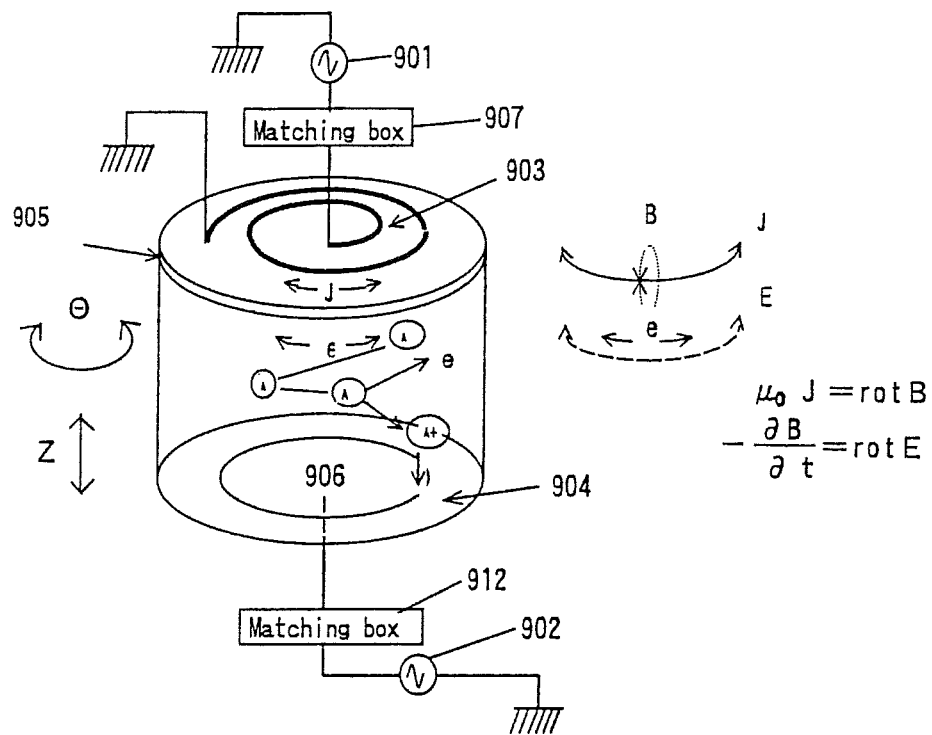
FIGS. 19A and 19 B are diagrams for explaining the principle of the ICP.
Figure 19B:
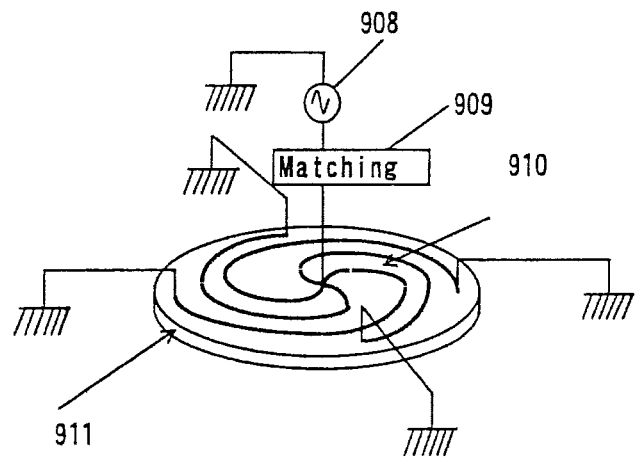
Figure 20A:
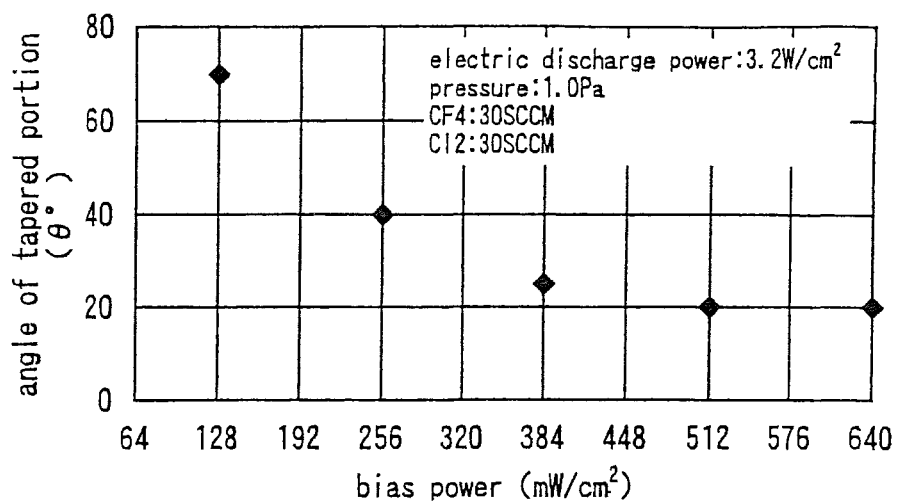
FIGS. 20A and 20B are graphs illustrating the relationship between an angle of a taper portion in an edge portion of a W film formed by patterning and the etching conditions.
Figure 20B:
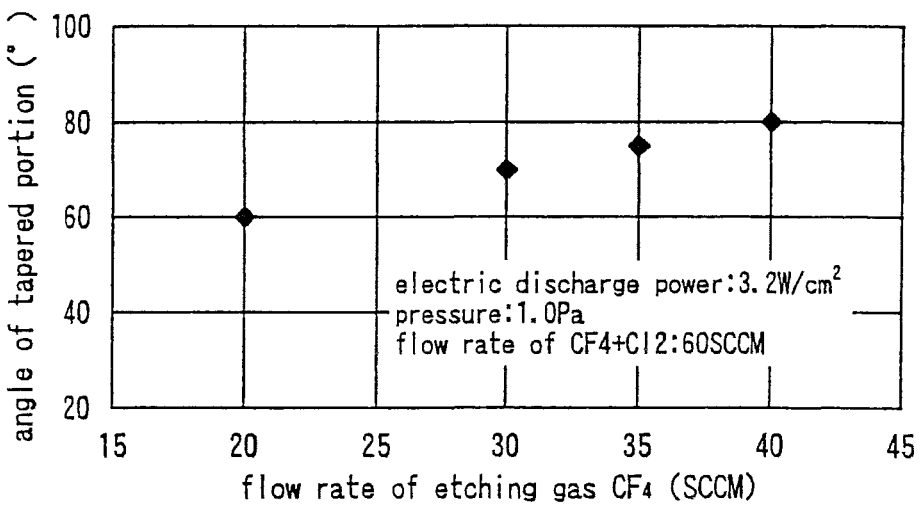

FIG. 18 illustrates an example of the circuit structure of the active matrix substrate described in Embodiments 1 to 3, and shows the circuit structure of a direct-view type display device. This active matrix substrate is composed of the image signal driver circuit 606, the scanning signal driver circuits (A) and (B) 605, and the pixel portion 604. Note that the driver circuit stated throughout the present specification is a generic term including the image signal driver circuit 606 and the scanning signal driver circuits 605.

The image signal driver circuit 606 comprises a shift register circuit 501a, a level shifter circuit 502a, a buffer circuit 503a, and a sampling circuit 504. In addition, the scanning signal driver circuits (A) and (B) 185 comprises of a shift register circuit 501b, a level shifter circuit 502b, and a buffer circuit 503b.

The driving voltages of the shift register circuits 501a and 501b are between 5 and 16V (typically 10V). A TFT of a CMOS circuit for forming this circuit is formed of the first p-channel TFT (A) 200a and the first n-channel TFT (A) 201a of FIG. 3C, or the TFT may be formed of the first p-channel TFT (B) 200b and the first n-channel TFT (B) 201b shown in FIG. 8A. In addition, since the driving voltage of the level shifter circuits 502a and 502b and the buffer circuits 503a and 503b become as high as 14 to 16V, it is preferable that the TFT structure be formed into a multi-gate structure as shown in FIG. 8A. Forming the TFT into a multi-gate structure is effective in raising voltage-resistance and improving the reliability of the circuits.

The sampling circuit 504 comprises an analog switch and its driving voltage is between 14 to 16V. Since the polarity alternately reverses to be driven and there is a necessity to reduce the off current value, it is desired that the sampling circuit 504 be formed of the second p-channel TFT (A) 202a and the second n-channel TFT (A) 203a as shown in FIG. 3C. Alternatively, the sampling circuit may be formed of the second p-channel TFT (B) 200b and the second n-channel TFT (B) 201b of FIG. 8B in order to effectively reduce the off current value.

Further, the driving voltage of the pixel portion is between 14 and 16 V. From a viewpoint of reducing power consumption, there is a demand to further reduce the off current value than that of the sampling circuit. Accordingly, as a basic structure, the pixel portion is formed into a multi-gate structure as the pixel TFT 204 shown in FIG. 3C.

Note that the structure of this Embodiment can be readily realized by manufacturing the TFT in accordance with the steps shown in Embodiments 1 through 3. The structures of the pixel portion and the driver circuits only are shown in this embodiment. Other circuits such as a signal divider circuit, a frequency dividing circuit, a D/A converter, a γ correction circuit, an op-amp circuit, and further signal processing circuits such as a memory circuit and an arithmetic operation circuit, and still further a logic circuit, may all be formed on the same substrate in accordance with the processes of Embodiments 1 through 3.

Embodiment 7

An active matrix substrate, a liquid crystal display device and an EL type display manufactured by implementing the present invention can be used in various electro-optical devices. The present invention can then be applied to all electronic appliances that incorporate this kind of electro-optical device as a display medium. The following can be given as this type of electronic appliance: a personal computer; a digital camera; a video camera; a portable information terminal (such as a mobile computer, a portable telephone, and an electronic book); and a navigation system.

Figure 21A:
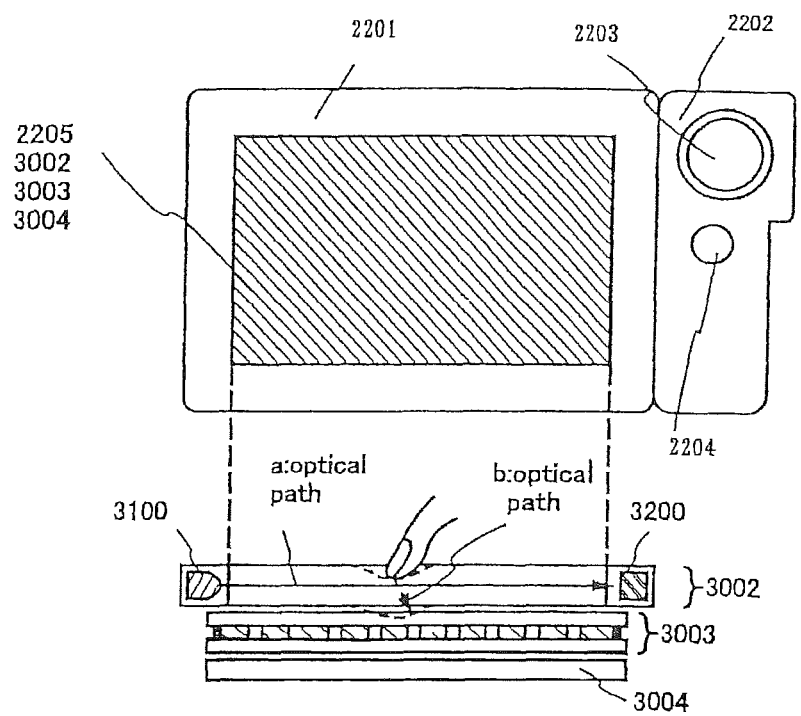
FIGS. 21A and 21B are diagrams showing an example of a portable information terminal.

FIG. 21A shows a portable information terminal, which is composed of a main body 2201, an image input unit 2202, an image receiving unit 2203, operation switches 2204, and a display device 2205. The present invention can be applied to the display device 2205 and to other signal control circuits.

This type of portable information terminal is often used outdoors not to mention indoors. In using this portable information terminal outdoors for hours, the reflection type liquid crystal display device, which uses external light instead of utilizing a backlight, is suitable as a low power consumption type, whereas the transmission type liquid crystal display device provided with a backlight is suitable when the surrounding is dark or not bright enough. Thus, from this context, a hybrid type liquid crystal display device that has both the characteristics of the reflection type and of the transmission type has been developed. The present invention is also applicable to this type of hybrid liquid crystal display device. The display device 2205 comprises a touch panel 3002, a liquid crystal display device 3003, and an LED backlight 3004. The touch panel 3002 is provided for the purpose of making the operation of the portable information terminal simpler and easier. The touch panel 3002 structure is composed of a light emitting element 3100 such as an LED provided in one end, and provided on the other end is a light receiving element 3200 such as a photo diode, and then a light path is formed between these two elements. If the light path is blocked off by pressing the touch panel 3002, an output from the light receiving element 3200 changes. Thus, with this principle, the light emitting elements and the light receiving elements are arranged in a matrix manner on the liquid crystal display device, to thereby function as an input medium.

Figure 21B:
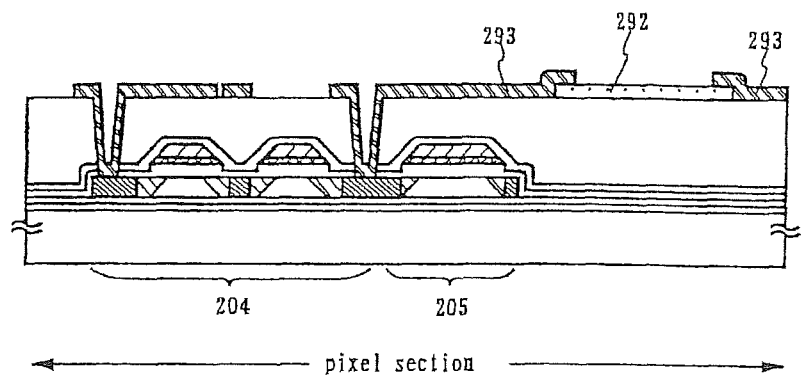

FIG. 21B shows the structure of the pixel section of the hybrid type liquid crystal display device in which the drain wiring 293 and the pixel electrode 292 are provided on the second interlayer insulating film on the pixel TFT 204 and the storage capacitor 205. This kind of structure can be formed by applying Embodiment 3. The drain wiring has a laminate structure of the Ti film and the Al film, and also serves as the pixel electrode. The transparent conductive material explained in Embodiment is used to form the pixel electrode 292. By manufacturing the liquid crystal display device 3003 from this kind of active matrix substrate, it can be suitably applied to the portable information terminal.

FIG. 22A shows a personal computer comprising a main body 2001 provided with a microprocessor, a memory and the like, an image inputting unit 2002, a display device 2003, and a key board 2004. The present invention may form the display device 2003 and other signal control circuits.

FIG. 22B shows a video camera, which is composed of a main body 2101, a display device 2102, an audio input unit 2103, operation switches 2104, a battery 2105, and an image receiving unit 2106. The present invention can be applied to the display device 2102 and to other signal control circuits.

FIG. 22C shows electronic game equipment such as a television game or a video game, which is composed of: a main body 2301 loaded with electronic circuits 2308 such as a CPU, and a recording medium 2304; a controller 2305; a display device 2303; and a display device 2302 built into the main body 2301. The display device 2303 and the display device 2302 incorporated into the main body 2301 may both display the same information, or the former may be taken as a main display and the latter may be taken as a sub-display to display information from the recording medium 2304 or the equipment operation status, or touch sensors can be added to use it as an operating panel. Further, in order for the main body 2301, the controller 2305, and the display device 2303 to transmit signals to each other, wired communication may be used, or sensor units 2306 and 2307 can be provided for either wireless communication or optical communication. The present invention can be applied to the display devices 2302 and 2303. A conventional CRT can also be used for the display device 2303.

FIG. 22D shows a player which uses a recording medium with a program recorded therein (hereafter referred to as a recording medium), and which is composed of a main body 2401, a display device 2402, speaker units 2403, a recording medium 2404, and operation switches 2405. Note that a DVD (Digital Versatile Disk), or Compact Disk (CD) is used as the recording medium for this device, and that the device is capable of reproduction of a music program, display of an image, and information display through video games (or television games) and through the Internet. The present invention can be suitably used for the display device 2402 and other signal control circuits.

FIG. 22E shows a digital camera, which is composed of a main body 2501, a display device 2502, an eye piece portion 2503, operation switches 2504, and an image receiving unit (not shown in the figure). The present invention can be applied to the display device 2502 and to other signal control circuits.

Figure 23A:
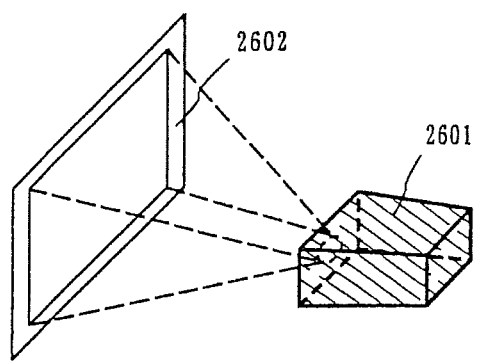
FIGS. 23A to 23D are diagrams showing a structure of a projector type liquid crystal display device.
Figure 23B:
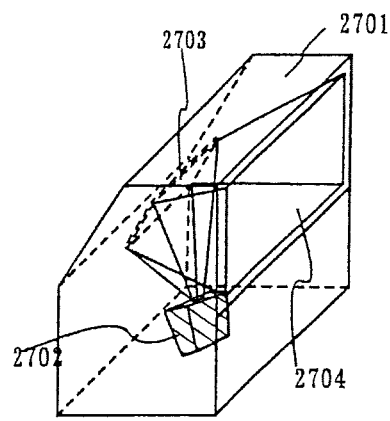

FIG. 23A shows a front type projector, which is composed of an optical light source system and display device 2601, and a screen 2602. The present invention can be applied to the display device, and to other signal control circuits. FIG. 23B shows a rear type projector, which is composed of a main body 2701, an optical light source system and display device 2702, a mirror 2703, and a screen 2704. The present invention can be applied to the display device, and to other signal control circuits.

Figure 23C:
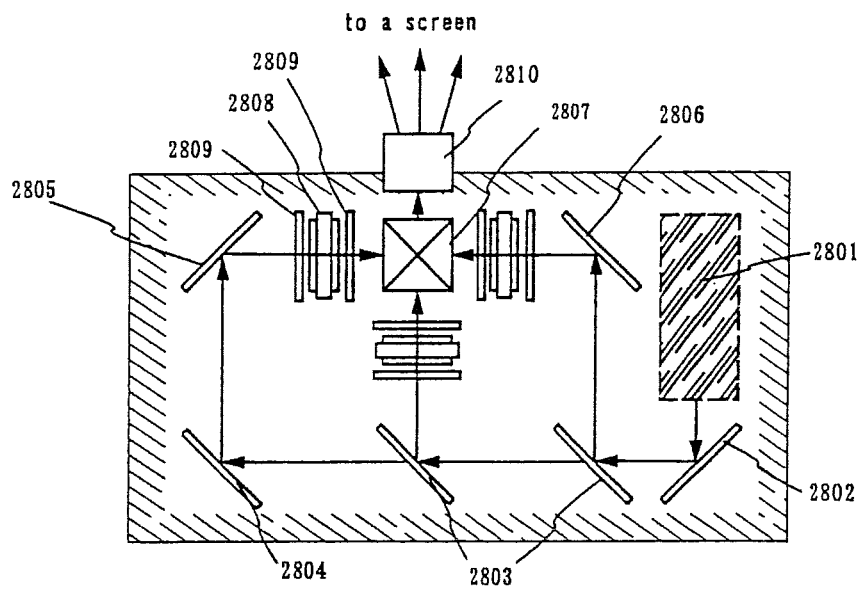
Figure 23D:
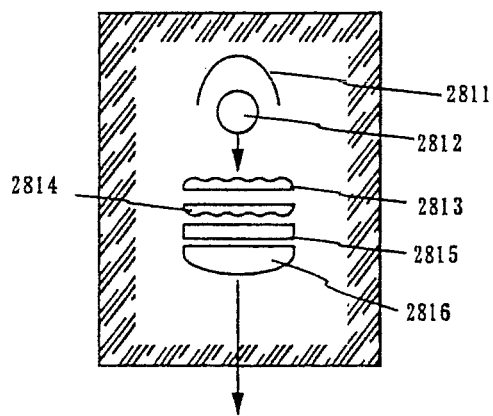
Figure 24A:
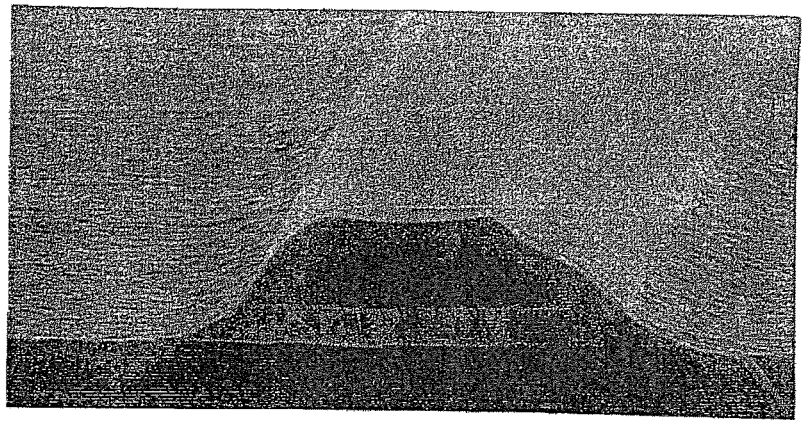
FIG. 24A to 24C are electron microscope photographs showing a shape in an edge portion of a W film that has been formed by patterning.
Figure 24B:
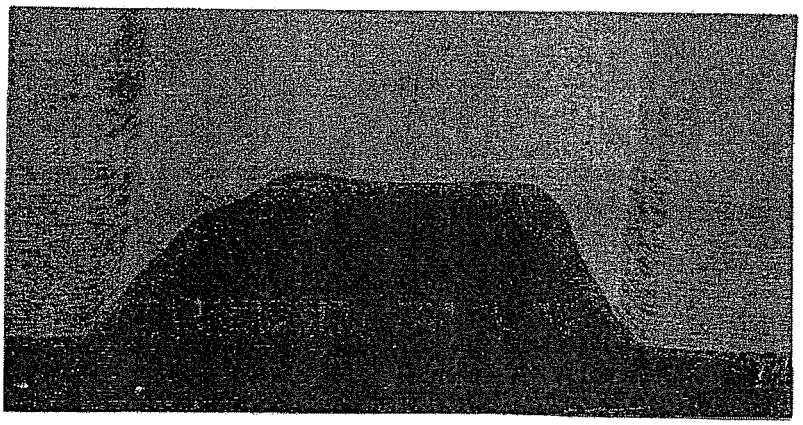
Figure 24C:
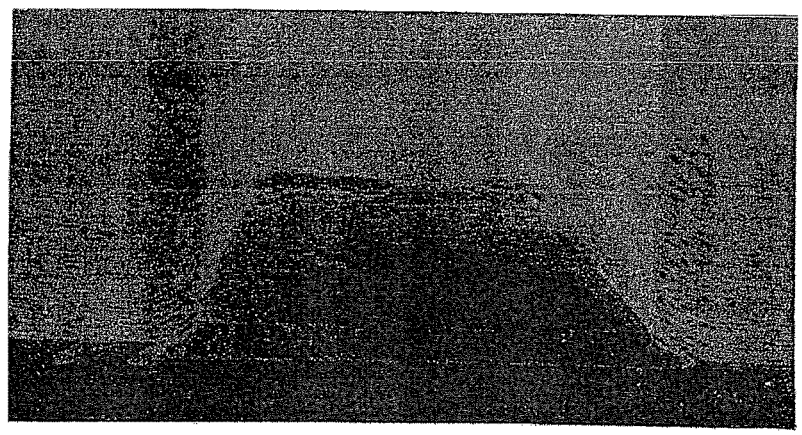

FIG. 23C is a drawing showing an example of the structure of the optical light source system and the display devices 2601 and 2702 in FIGS. 23A and 23B. The optical light source system and display devices 2601 and 2702 each consist of an optical light source system 2801, mirrors 2802 and 2804 to 2806, dichroic mirrors 2803, a beam splitter 2807, liquid crystal display devices 2808, phase difference plates 2809, and an optical projection system 2810. The optical projection system 2810 is composed of a plural number of optical lenses. In FIG. 23C an example of a three plate system is shown in which three liquid crystal display devices 2808 are used, but there are no special limitations and an optical system of single plate system is acceptable, for example. Further, the operator may suitably set optical lenses, polarizing film, film to regulate the phase, IR films, etc., within the optical path shown by the arrows in FIG. 23C. In addition, FIG. 23D shows an example of the structure of the optical light source system 2801 of FIG. 23C. In this embodiment, the optical light source system 2801 is composed of a reflector 2811, a light source 2812, lens arrays 2813 and 2814, a polarization conversion element 2815, and a condenser lens 2816. Note that the optical light source system shown in FIG. 23D is an example, and it is not limited to the structure shown in the figure.

Further, although not shown in the figures, it is also possible to apply the present invention to, for example, a read-in circuit of a navigation system or an image sensor. Thus the application range for the present invention is extremely wide, and it can be applied to electronic equipment in all fields. Further, the electronic equipment of this embodiment can be realized with techniques disclosed in Embodiments 1 to 5.

With the present invention, in a semiconductor device (concretely electro-optical device, in this specification) having a plurality of functional circuits formed on the same single substrate, TFTs of suitable capability may be arranged in accordance with specifications the respective circuit require, greatly improving the operation characteristic and reliability of the semiconductor device.

The active matrix substrate structure in which LDD regions of the p-channel TFT of the driver circuit is formed to overlap the gate electrode, and LDD structure of the n-channel TFT and the pixel TFT are made to partially overlap the gate electrodes, can be manufactured by using 6 photomasks in accordance with the manufacturing method of the semiconductor device of the present invention. The reflection type liquid crystal display device can be manufactured from this kind of active matrix substrate. In addition, the transmission type liquid crystal display device can be manufactured by using 7 photomasks in accordance with the manufacturing method of the present invention.

In a TFT having the gate electrode formed from a heat-resistant conductive material and the gate wiring formed from a low-resistant conductive material, the active matrix substrate structure in which LDD regions of the p-channel TFT of the driver circuit is formed to overlap the gate electrode, and LDD structure of the n-channel TFT and the pixel TFT are made to partially overlap the gate electrodes, can be manufactured by using 6 photomasks in accordance with the manufacturing method of the semiconductor device of the present invention. The reflection type liquid crystal display device can be manufactured from this kind of active matrix substrate. In addition, the transmission type liquid crystal display device can be manufactured by using 7 photomasks in accordance with the manufacturing method of the present invention.

What is claimed is:
1. A semiconductor device comprising:
   a transistor comprising:
      a first semiconductor layer including a pair of LDD regions, a channel region between the pair of LDD regions, and source and drain regions;

an insulating layer over the first semiconductor layer; and a gate electrode over the insulating layer, the gate electrode including a first tapered side surfaces; and a capacitor comprising:
  a second semiconductor layer including an impurity region, the second semiconductor layer being contiguous with the first semiconductor layer; and
  a capacitor wiring over the second semiconductor layer, the capacitor wiring including a second tapered side surfaces,
wherein the insulating layer includes a first region overlapping the channel region and a second region overlapping one of the source and drain regions, and
wherein a thickness of the first region is thicker than the second region.

2. The semiconductor device according to claim 1, further comprising:
  an interlayer insulating layer over the gate electrode; and
  a pixel electrode over the interlayer insulating layer, the pixel electrode electrically connected to the first semiconductor layer.

3. The semiconductor device according to claim 2, further comprising:
  a wiring over the interlayer insulating layer, the wiring in contact with one of the source and drain regions,
  wherein the pixel electrode is electrically connected to the first semiconductor layer thorough the wiring.

4. The semiconductor device according to claim 3, wherein the wiring overlaps the pixel electrode.

5. The semiconductor device according to claim 3, wherein the pixel electrode overlaps the wiring.

6. The semiconductor device according to claim 1, wherein an angle of each of the first tapered side surfaces is in a range between 5° and 45° with respect to a surface of the insulating layer.

7. A semiconductor device comprising:
  a transistor comprising:
    a first semiconductor layer including a pair of LDD regions, a channel region between the pair of LDD regions, and source and drain regions;
    an insulating layer over the first semiconductor layer; and
    a gate electrode over the insulating layer, the gate electrode including a first tapered side surfaces; and
  a capacitor comprising:
    a second semiconductor layer including an impurity region, the second semiconductor layer being contiguous with the first semiconductor layer; and
    a capacitor wiring over the second semiconductor layer, the capacitor wiring including a second tapered side surfaces,
  wherein the insulating layer includes a first region overlapping the channel region and a second region overlapping one of the source and drain regions,
  wherein a thickness of the first region is thicker than the second region,
  wherein the first tapered side surfaces of the gate electrode and the pair of LDD regions overlap each other, and
  wherein a side edge of the gate electrode aligns with both a side edge of the first region and a side edge of the channel region.

8. The semiconductor device according to claim 7, further comprising:
  an interlayer insulating layer over the gate electrode; and
  a pixel electrode over the interlayer insulating layer, the pixel electrode electrically connected to the first semiconductor layer.

9. The semiconductor device according to claim 8, further comprising:
  a wiring over the interlayer insulating layer, the wiring in contact with one of the source and drain regions,
  wherein the pixel electrode is electrically connected to the first semiconductor layer thorough the wiring.

10. The semiconductor device according to claim 9, wherein the wiring overlaps the pixel electrode.

11. The semiconductor device according to claim 9, wherein the pixel electrode overlaps the wiring.

12. The semiconductor device according to claim 7, wherein an angle of each of the first tapered side surfaces is in a range between 5° and 45° with respect to a surface of the insulating layer.

13. A semiconductor device comprising:
  a transistor comprising:
    a first semiconductor layer on an insulating surface, the first semiconductor layer including a pair of LDD regions, a channel region between the pair of LDD regions, and source and drain regions;
    an insulating layer over the first semiconductor layer; and
    a gate electrode over the insulating layer, the gate electrode including a first tapered side surfaces; and
  a capacitor comprising:
    a second semiconductor layer including an impurity region, the second semiconductor layer being contiguous with the first semiconductor layer; and
    a capacitor wiring over the second semiconductor layer, the capacitor wiring including a second tapered side surfaces,
  wherein the insulating layer includes a first region overlapping the channel region and a second region overlapping one of the source and drain regions,
  wherein a thickness of the first region is thicker than the second region,
  wherein angles of the first tapered side surfaces of the gate electrode with respect to the insulating surface is different from angles of side surfaces of the first region of the insulating layer, and
  wherein a side edge of the gate electrode aligns with both a side edge of the first region and a side edge of the channel region.

14. The semiconductor device according to claim 13, further comprising:
  an interlayer insulating layer over the gate electrode; and
  a pixel electrode over the interlayer insulating layer, the pixel electrode electrically connected to the first semiconductor layer.

15. The semiconductor device according to claim 14, further comprising:
  a wiring over the interlayer insulating layer, the wiring in contact with one of the source and drain regions,
  wherein the pixel electrode is electrically connected to the first semiconductor layer thorough the wiring.

16. The semiconductor device according to claim 15, wherein the wiring overlaps the pixel electrode.

17. The semiconductor device according to claim 15, wherein the pixel electrode overlaps the wiring.

18. The semiconductor device according to claim 13, wherein an angle of each of the first tapered side surfaces is in a range between 5° and 45° with respect to a surface of the insulating layer.

19. The semiconductor device according to claim 13, wherein the angles of the side surfaces of the first region is perpendicular to the insulating surface.

* * * * *